US006552357B2

United States Patent
Akita

(10) Patent No.: US 6,552,357 B2
(45) Date of Patent: Apr. 22, 2003

(54) SEMICONDUCTOR MEMORY DEVICE HAVING PLATE LINES AND PRECHARGE CIRCUITS

(75) Inventor: Hironobu Akita, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/077,899

(22) Filed: Feb. 20, 2002

(65) Prior Publication Data

US 2002/0075720 A1 Jun. 20, 2002

Related U.S. Application Data

(60) Division of application No. 09/609,774, filed on Jul. 3, 2000, which is a continuation-in-part of application No. 09/256,302, filed on Feb. 24, 1999, now abandoned.

(30) Foreign Application Priority Data

Feb. 27, 1998 (JP) ............................................. 10-046439

(51) Int. Cl.$^7$ ............................................. H01L 29/06
(52) U.S. Cl. ..................... 257/10; 365/149; 365/184; 365/203; 365/205; 365/226; 257/337
(58) Field of Search ................................. 365/149, 184, 365/203, 205, 226

(56) References Cited

U.S. PATENT DOCUMENTS

| | | |
|---|---|---|
| 5,432,746 A | 7/1995 | Guedj |
| 5,544,114 A | 8/1996 | Gaultier et al. |
| 5,615,144 A | 3/1997 | Kimura et al. |
| 5,748,534 A | 5/1998 | Dunlap et al. |
| 5,805,495 A | 9/1998 | Kimura |
| 5,953,246 A | 9/1999 | Takashima et al. |
| 6,411,543 B2 * | 6/2002 | Narui et al. ................. 365/149 |

OTHER PUBLICATIONS

Toshiaki: Kirihara; "Flexible Test Mode Approach for 256–Mb DRAM" IEEE Journal of Solid–State Circuits, vol. 32, No. 10; pp. 1525–1534; Oct. 1997.

* cited by examiner

Primary Examiner—David Nelms
Assistant Examiner—Mai-Huong Tran
(74) Attorney, Agent, or Firm—Banner & Witcoff, Ltd.

(57) ABSTRACT

A dynamic semiconductor memory device includes memory cells each having a one-transistor/one-capacitor. The memory cells are arranged at their respective intersections of bit lines and word lines. Bit-line precharge circuits are provided at bit line pairs, respectively, to precharge and equalize the bit line pairs. An output potential of a plate potential generator is applied to the power supply terminals of the bit-line precharge circuits. The memory cells have a plurality of capacitors. A plate electrode of the capacitors are connected in common. An insulation film is formed on the plate electrode and a wiring layer is formed on the insulation film. The wiring layer is electrically connected to the plate electrode through a via hole formed in the insulation film and connected in common to the power supply terminals of the bit-line precharge circuits through a contact hole formed in the insulation film, thereby transmitting a potential in proportion to variations in plate potential.

35 Claims, 14 Drawing Sheets

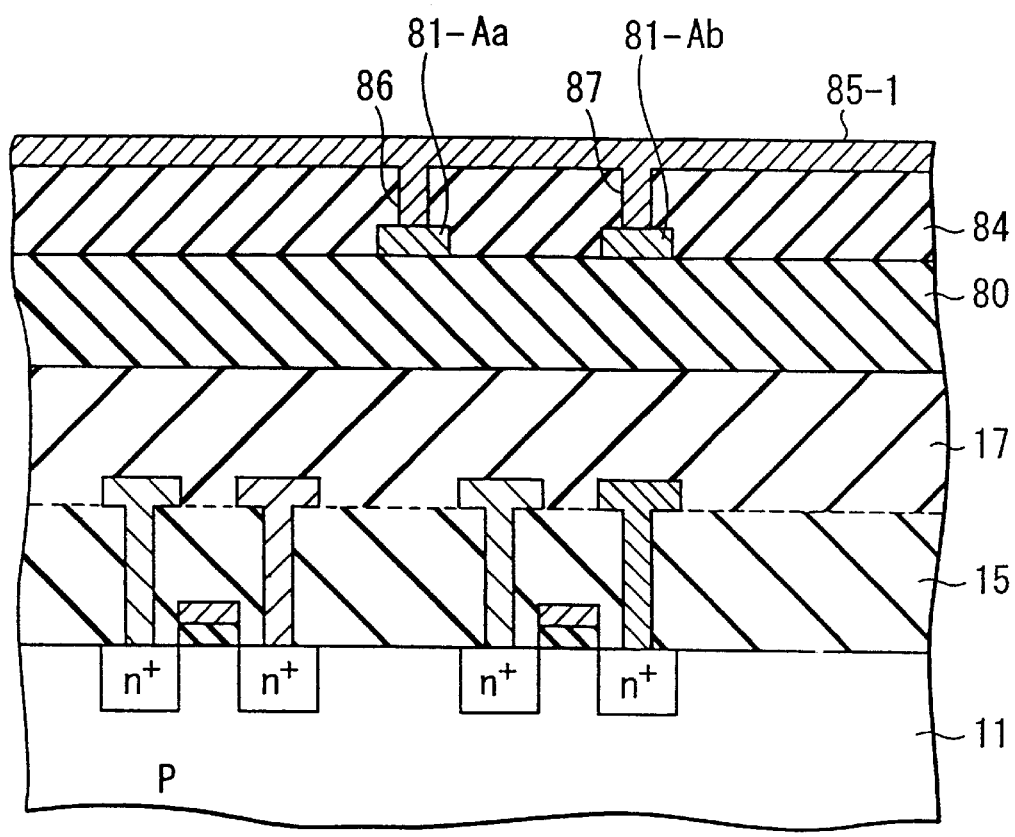
F I G. 13C

SEMICONDUCTOR MEMORY DEVICE HAVING PLATE LINES AND PRECHARGE CIRCUITS

CROSS-REFERENCE TO RELATED APPLICATIONS

This application is a Divisional of U.S. application Ser. No. 09/609,774 filed on Jul. 3, 2000; which is a CIP of U.S. application Ser. No. 09/256,302, filed on Feb. 24, 1999 now abandoned, both of which are hereby incorporated by reference as to their entireties.

BACKGROUND OF THE INVENTION

The present invention relates to a semiconductor memory device having plate lines and precharge circuits.

As illustrated in FIG. 1, a semiconductor memory such as a DRAM (dynamic RAM) includes one MOS transistor Q for data transfer and one capacitor C for data storage. The drain of the MOS transistor is connected to a bit line BL, the source thereof is connected to one electrode of the capacitor, and the gate thereof is connected to a word line WL. A connecting point of the source of the MOS transistor Q and the one electrode of the capacitor C serves as a storage node N. The other electrode opposed to the one electrode with a capacitor insulation film interposed therebetween, serves as a plate electrode PL common to a plurality of capacitors C. A potential of, e.g., Vcc/2 is applied from a plate potential generator 10 to the plate electrode PL. The above DRAM is described in Kirihata et al., "Flexible Test Mode Approach for 256-Mb DRAM", IEEE Journal of SOLID-STATE Circuits, Vol. 32, No. 10, October, 1997, pp. 1525–1534.

In a selected memory cell of the foregoing DRAM, the MOS transistor Q is turned on to charge/discharge the capacitor C in the sense/write mode. The potential variations of the storage node N vary the potential of the plate electrode PL and, in other words, noise remains on the plate electrode PL. More specifically, when data "0" is written to a memory cell in which data "1" (=Vcc) has been stored, the plate potential is varied as shown in FIG. 2. In the case of FIG. 2, the potential amplitude of the bit line BL is changed between Vcc (e.g., 3.3V) and Vss (e.g., 0V), the precharge potential and plate potential of the bit line BL are each set at Vcc/2, and the word line WL is driven at boost potential Vpp (e.g., 4.5V). When the potential of the word line WL rises and the MOS transistor Q turns on, the capacitor C is set in a discharge mode, and the storage node N is decreased in potential, while the bit line BL is charged by the capacitor C and thus increased in potential. In this case, the potential of the plate electrode PL is slightly lowered by capacitance coupling between the plate electrode PL and the electrode alongside the storage node N of the capacitor C. When a sense amplifier starts to operate, the potential variations of the bit line BL are amplified and thus the potentials of both the bit line BL and storage node N are increased to Vcc. As the potential of the storage node N increases, the plate potential slightly increases. When a write operation starts, write data "0" is transferred to the bit line BL, and the potentials of the bit line BL and storage node N are each dropped to a Vss level. In response to the variations in potential, the plate potential slightly lowers and then gradually returns to a Vcc/2 level.

As described above, the plate potential varies with an access operation of the memory cells. The variation $\Delta VPL$ of the plate potential is expressed by the following equation (1) using the potential variation $\Delta VSN$ of the storage node N:

$$\Delta VPL = \Delta VSN \times (Cs/CPL) \quad (1)$$

where Cs is capacitance of the capacitor C and CPL is capacitance of the plate electrode PL (the sum of capacitance of capacitors C sharing one plate electrode PL).

Since the capacitance Cs of the capacitor C is smaller than that CPL of the plate electrode PL, an influence of potential variations of one storage node N upon the plate potential is small. If, however, the potentials of plural storage nodes N are varied in the same direction at the same time, the variation $\Delta VPL$ of the plate potential cannot be ignored. In FIG. 2, the plate potential is almost recovered by one cycle of a selected word line (row cycle: a period during which the word line rises from Vss to Vpp, decreases to Vss and then start to rise next); however, there is a case where the plate potential cannot be recovered within the row cycle because of the resistance of the plate electrode itself, the resistance of wiring between the plate potential generator 10 and plate electrode PL, and the current driving performance of the generator 10. In particular, as the DRAM increases in degree of integration, the electrodes of capacitors C sharing one plate electrode PL increases in number and the capacitance of the plate electrode PL becomes large. Furthermore, the wiring is thinned and lengthened and its resistance between the plate potential generator 10 and the plate electrode PL is heightened. In the row cycle, therefore, the plate potential is more and more difficult to recover.

If a memory cell includes a capacitor C having a large leak, the storage node N and plate-electrode PL are short-circuited. Usually such a memory cell is treated as a defective and replaced with a spare memory cell by a redundancy circuit. This defective memory cell is not used for data storage. Since, however, the defective memory cell is not separated from the bit line, the potential variations of the bit line are directly applied to the plate electrode in the sense/write mode, thereby causing great variations in plate potential.

An influence of the above plate potential variations will now be described in detail. Under the circumstance where the plate potential is not varied, the readout voltage Vsense of the bit line BL is expressed by the following equation (2):

$$Vsense = (Vcell - VBL) \times \{Cs/(Cb+Cs)\} \quad (2)$$

where Vcell is potential of the storage node N immediately before the potential of the word line WL rises, VBL is precharge potential of the bit line BL, Cs is capacitance of the capacitor C, and Cb is capacitance of the bit line BL.

If the plate potential varies only by $\Delta VPL$, then the readout voltage Vsense of the bit line BL is given by the following equation (3):

$$Vsense = (Vcell + \Delta VPL - VBL) \times \{Cs/(Cb+Cs)\} \quad (3)$$

If the plate potential varies to lower ($\Delta VPL<0$), the readout potential of data "0" (Vcell=Vss) decreases and the readout voltage (potential difference) increases in the sense mode. Since, however, the readout potential of data "1" also decreases, a margin for reading data "1" is reduced. If, by contraries, the plate potential varies to rise ($\Delta VPL>0$), a margin for reading data "0" is reduced in the sense mode.

If the word lines are selected in sequence for high-speed row access, the sense amplifier is operated frequently; therefore, an amount of noise superimposed upon the plate electrode PL is increased and a malfunction will easily be caused due to a reduction in margin. This is one factor which prevents the DRAM from operating at high speed.

BRIEF SUMMARY OF THE INVENTION

An object of the present invention is to provide a semiconductor memory device capable of suppressing potential variations of a plate electrode.

Another object thereof is to provide a semiconductor memory device capable of high-speed access without reducing a margin for readout operations even by potential variations of a plate electrode.

To attain the above objects, according to a first aspect of the present invention, there is provided a semiconductor memory device comprising bit lines, word lines crossing the bit lines, memory cells arranged at intersections of the bit lines and word lines, and including a plurality of capacitors to which a plate electrode is connected in common, an insulation film formed on the plate electrode, a bit-line precharge circuit for precharging the bit lines, and a wiring layer formed on the insulation film and electrically connected to the plate electrode and a power supply terminal of the bit-line precharge circuit.

In the semiconductor memory device so constituted, if the plate electrode common to the capacitors of memory cells is used as power supplies of the bit-line precharge circuits, the potential variations of the plate electrode are suppressed. When the plate potential varies, the precharge potential of the bit lines varies accordingly and these variations are canceled each other at a readout voltage of the memory cells. Consequently a margin for readout operations is not reduced and high-speed access can be achieved. Since the potential stability of the plate electrode is not needed, a low-performance plate potential generator can be used. Since, moreover, the layout of the plate potential generator or the wiring resistance between the plate potential generator and the plate electrode need not be taken into consideration, the degree of freedom of the layout is increased.

Though the plate electrode is low in current supply capability, it can be used as a power supply to correct a difference in bit-line precharge potential sufficiently.

According to a second aspect of the present invention, there is provided a semiconductor memory device comprising bit lines, word lines crossing the bit lines, memory cells arranged at intersections of the bit lines and the word lines, the memory cells including a plurality of capacitors to which a plate electrode is connected in common, a first insulation film formed on the plate electrode, a bit-line precharge circuit for precharging the bit lines, a first wiring layer formed on the first insulation film along a direction crossing the bit lines, the first wiring layer being connected to the plate electrode through a first via hole located on the plate electrode of the first insulation film, a second wiring layer formed on the first insulation film along a direction crossing the bit lines, the second wiring layer being connected to a power supply terminal of the bit-line precharge circuit through a contact hole located on the bit-line precharge circuit of the first insulation film, a second insulation film formed on the first wiring layer, the second wiring layer, and the first insulation film, and a third wiring layer formed on the second insulation film along a direction which is equal to that of the bit lines, the third wiring layer being connected to the first wiring layer through a second via hole formed in the second insulation film and the second wiring layer through a third via hole formed in the second insulation film.

In the semiconductor memory device so constituted, a power supply potential is applied from the plate electrode to the bit-line precharge circuits. Therefore, when the plate potential varies, the precharge potential of the bit lines varies accordingly and these variations are canceled each other at a readout voltage of the memory cells. Consequently a margin for readout operations is not reduced and high-speed access can be achieved. Since, furthermore, the plate electrode is connected to the power supply terminals of the bit-line precharge circuits, the power supply wiring thereof need not be routed and thus a chip area can effectively be utilized. Since, moreover, the potential of the plate electrode need not be stabilized, a high-performance plate potential generator is not required, and the layout of the plate potential generator or the wiring resistance between the plate potential generator and plate electrode need not be taken into consideration, thereby improving the degree of freedom of the layout. Moreover, the plate electrode does not pass on the sense amplifier. Even in the shared sense amplifier, noise generated during the operation of the sense amplifier can be inhibited from being added to the plate electrode and a readout margin can be prevented from lowering.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13C is a cross-sectional view taken along line 13C—13C of FIG. 13A in order to explain the modification to the DRAM according to the eighth embodiment of the present invention;

DETAILED DESCRIPTION OF THE INVENTION

Figure 1:
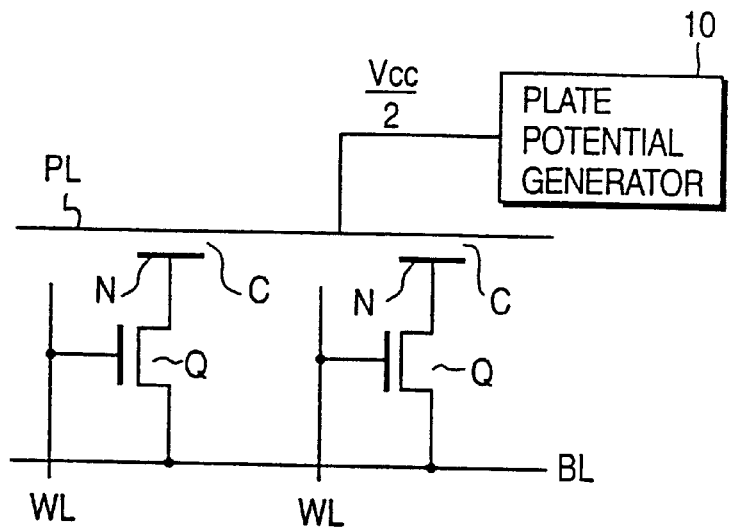
FIG. 1 is a circuit diagram illustrating a basic layout of memory cells of a prior art DRAM.
Figure 2:
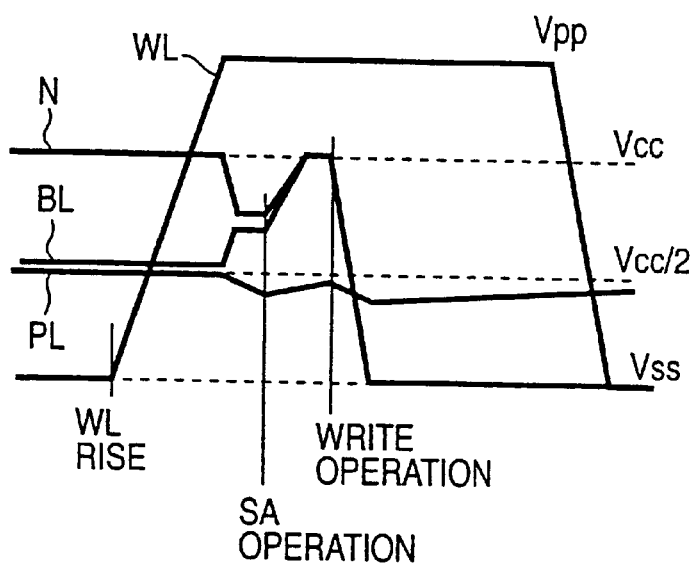
FIG. 2 is a waveform diagram showing potential variations of respective elements of the prior art DRAM in its write mode.
Figure 3:
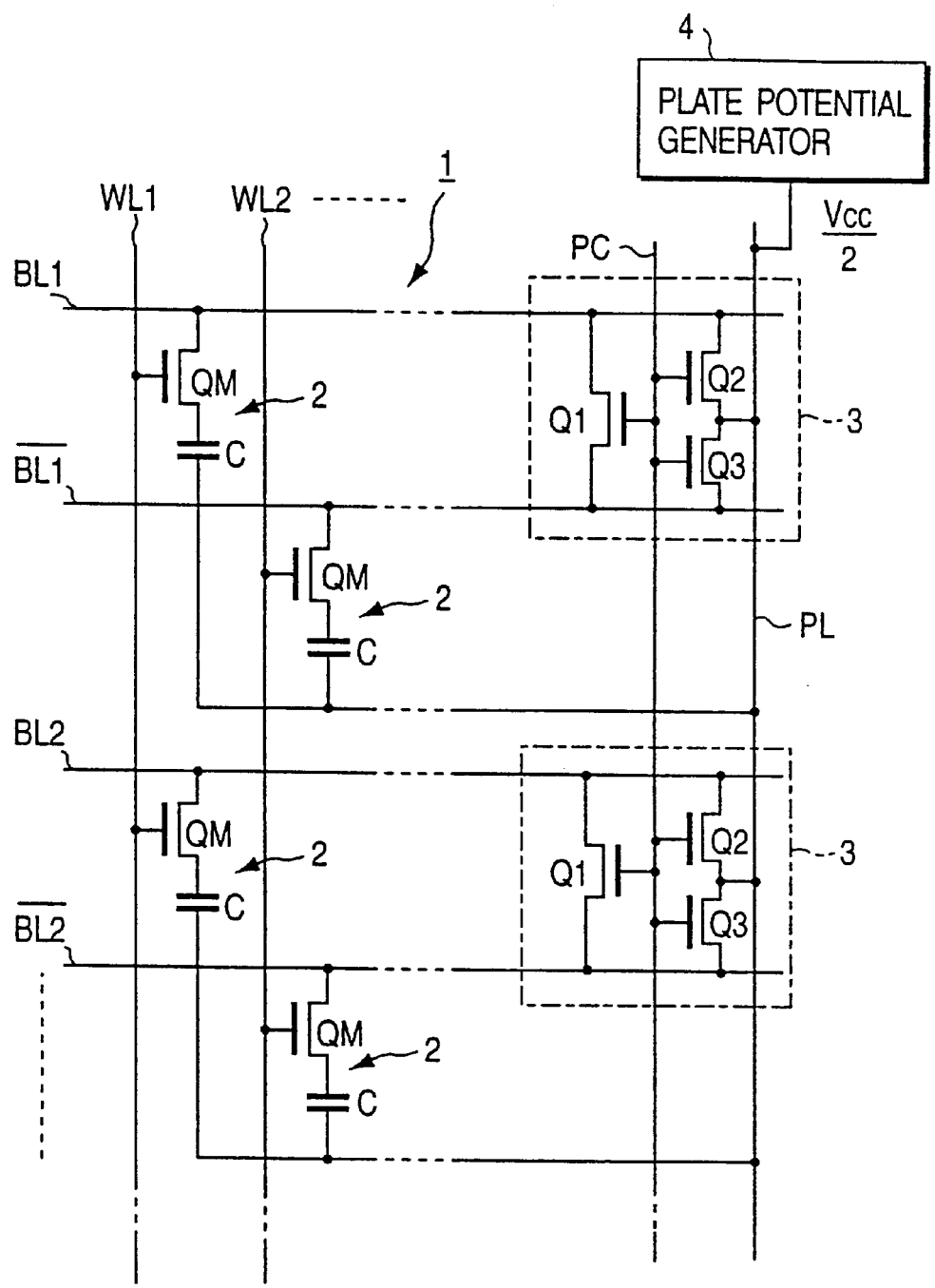
FIG. 3 is an equivalent circuit diagram of the main part of a DRAM according to a first embodiment of the present invention.

FIG. 3 is an equivalent circuit diagram showing the main part of a dynamic semiconductor memory device (DRAM) according to a first embodiment of the present invention. A memory cell array 1 includes pairs of bit lines BL1 and $\overline{BL1}$, BL2 and $\overline{BL2}$, ..., word lines WL1, WL2, ..., and dynamic memory cells 2. The bit lines and word lines cross each other, and the memory cells are arranged at their respective intersections of the bit lines and word lines. Each of the memory cells 2 includes a MOS transistor QM for data transfer and a capacitor C for data storage. The drain of the MOS transistor QM is connected to the bit line BLi or ☐ (i=1, 2, ... ), the source thereof is connected to one electrode of the capacitor C, and the gate thereof is connected to the word line WLj (j=1, 2, ... ). The other electrode of the capacitor C is connected to a plate electrode PL common to a plurality of capacitors C.

A bit-line precharge circuit 3 is provided between the paired bit lines BL1 and $\overline{BL1}$, BL2 and $\overline{BL2}$, ... and includes an equalizing MOS transistor Q1 and precharging MOS transistors Q2 and Q3. Each MOS transistor Q1 has a current path connected between the paired bit lines BL1 and $\overline{BL1}$, BL2 and $\overline{BL2}$, ... and is driven in response to a precharge signal PC to short-circuit the respective paired bit lines. Each drain of the precharging MOS transistor Q2 is connected to one of the paired bit lines, BL1, BL2, ..., and that of the precharging MOS transistor Q3 is connected to the other bit line $\overline{BL1}$, $\overline{BL2}$, ... These transistors Q2 and Q3 are driven in response to the precharge signal PC to precharge each of the paired bit lines. A plate electrode PL of a plurality of capacitors C (capacitors C included in memory cells 2 connected to the bit line pairs provided with the bit-line precharge circuits in this embodiment) is connected to the sources of the MOS transistors Q2 and Q3 which serve as power supply terminals of each of the bit-line precharge circuits 3. A reference potential is applied from a plate potential generator 4 to the plate electrode PL and, in the first embodiment, it is set to Vcc/2. The reference potential of Vcc/2 is thus applied as a power supply voltage to the bit-line precharge circuits 3 from the plate potential generation circuit 4, and a potential variation of the plate electrode PL of the bit line pairs to which the bit-line precharge circuits 3 are connected is transmitted to the circuits 3.

Figure 4:
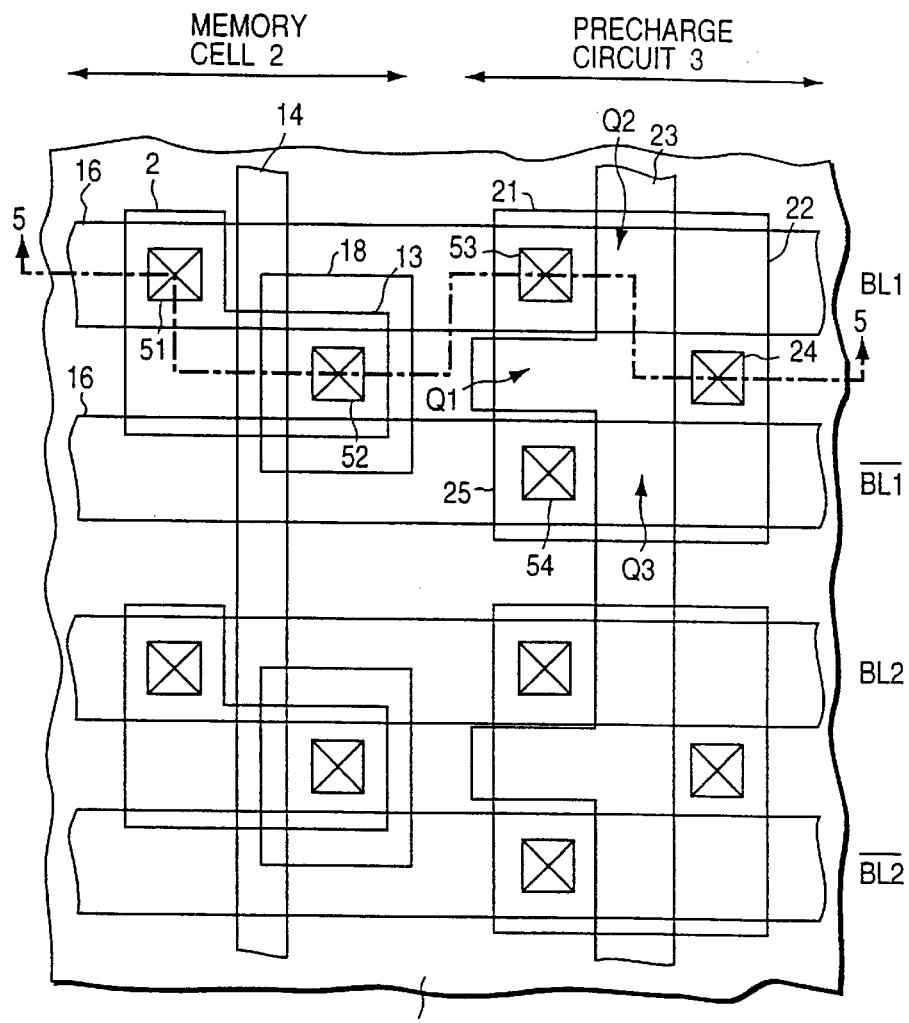
FIG. 4 is a plan view partly showing a pattern layout of a memory cell section and a bit-line precharge circuit in the DRAM according to the first embodiment of the present invention.
Figure 5:
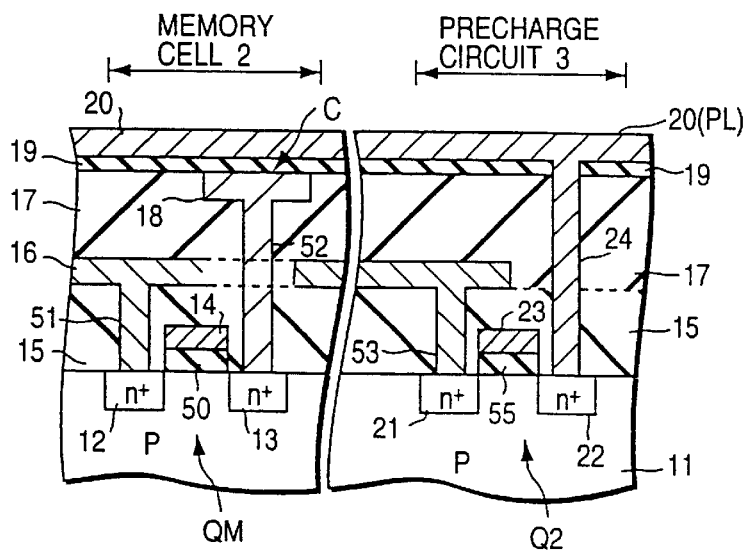
FIG. 5 is a cross-sectional view taken along line 5—5 of FIG. 4 and illustrating a layout of part of the memory cell section and bit-line precharge circuit.

FIG. 4 is a plan view partly showing a pattern layout of the memory cell 2 and the bit-line precharge circuit 3 in the DRAM illustrated in FIG. 3. FIG. 5 is a cross-sectional view taken along line 5—5 of FIG. 4.

As shown in FIG. 5, the memory cell 2 has a stacked-capacitor structure. More specifically, in the MOS transistor QM of the memory cell 2, $n^+$-type impurity diffusion layers 12 and 13 serving as a drain and a source are formed separately from each other in a p-type silicon substrate (or p-type well region) 11, and a gate insulation film 50 and a gate electrode 14 serving as a word line are formed between the layers 12 and 13 on the substrate 11. A first-level interlayer insulation film 15 is formed on the resultant semiconductor structure, a bit line 16 is formed on the film 15. The bit line 16 is connected to an $n^+$-type impurity diffusion layer (drain) 12 via a contact hole 51 formed in the interlayer insulation film 15. A second-level interlayer insulation film 17 is formed on both the interlayer insulation film 15 and bit line 16, and one electrode 18 of the capacitor C serving as a storage node is formed on the interlayer insulation film 17. The electrode 18 is connected to the $n^+$-type impurity diffusion layer 13 (source) via a contact hole 52 formed in the interlayer insulation films 15 and 17. A capacitor insulation film 19 is formed on both the interlayer insulation film 17 and electrode 18 and a plate electrode (PL) 20 serving as a common electrode of the plural capacitors C is provided on the capacitor insulation film 19.

In the bit-line precharge circuit 3, as shown in FIG. 4, three MOS transistors Q1 to Q3 are arranged along a gate electrode 23 functioning as a precharge signal line supplied with a precharge signal PC. Parts of the gate electrode 23 are protruded laterally, and three $n^+$-type impurity diffusion layers 21, 22 and 25 are formed so as to surround the gate electrode 23. The diffusion layers 21 and 22 and the gate electrode 23 sandwiched therebetween constitute a pre-charging MOS transistor Q2, the diffusion layers 22 and 25 and the gate electrode 23 sandwiched therebetween constitute another precharging MOS transistor Q3, and the diffusion layers 21 and 25 and the gate electrode 23 sandwiched therebetween constitute an equalizing MOS transistor Q1. Bit line pairs BL1 and $\overline{BL1}$ (bit line 16) are connected to the diffusion layers 21 and 25, which serve as drains of the MOS transistors Q2 and Q3, through contact holes 53 and 54, respectively.

In the MOS transistor Q2, as illustrated in FIG. 5, $n^+$-type impurity diffusion layers 21 and 22 serving as a drain and a source are formed in the p-type silicon substrate (or p-type well region) separately from each other, and both a gate insulation film 55 and a gate electrode 23 are formed on the substrate between the diffusion layers 21 and 22. The first-level interlayer insulation film 15 is formed on the resultant semiconductor structure. The bit line extending from the memory cell 2 on the interlayer insulation film 15, is connected to the n$^+$-type impurity diffusion layer 21 (drain) via the contact hole 53 formed in the film 15. The second-level interlayer insulation film 17 and capacitor insulation film 19 are formed the interlayer insulation film 15 and bit line 16, and the plate electrode (PL) 20 is formed on the capacitor insulation film 19. The plate electrode 20 extends from the memory cell array 1 into the bit-line precharge circuit 3 and is connected to the diffusion layer 22 (source) of the precharging MOS transistors Q2 and Q3 through a contact hole 24 formed in the interlayer insulation films 15 and 17 and capacitor insulation film 19. If, therefore, the plate electrode 20 varies in potential, the precharge power supply of the precharge circuit 3 does in response to (in proportion to) the potential variation of the electrode 20.

An operation of the DRAM according to the first embodiment of the present invention will now be described specifically.

One of the respectively paired bit lines BL1 and $\overline{BL1}$, BL2 and $\overline{BL2}$, . . . is set at a Vcc level and the other is set at a Vss level after a sense operation is completed. If these bit line pairs are short-circuited by the equalizing MOS transistors Q1 during the precharging, they are basically set at a precharge potential of Vcc/2. However, actually, the level is likely to difference from Vcc/2 because of a capacitance imbalance among the bit line pairs, a junction leak from the diffusion layers, and the like. This difference is corrected by the power supply of the bit-line precharge circuit 3 and a great current driving performance is not required therefor. Consequently, as in the first embodiment, the plate electrode (PL) 20 having a low current supply capability is connected to power supply terminals of the bit-line precharge circuits 3 and thus can be used as a precharge power supply.

Since the plate electrode 20 serves as a common electrode of capacitors C of the plural memory cells 2, the capacitance is increased. Even though the plate electrode 20 is used as a power supply for the bit-line precharge circuits 3, the plate potential is hardly varied. What is the more important is that even though the plate potential is varied, the output potential of the bit-line precharge circuits 3 varies with the variation of the plate potential. The sense margin is not therefore reduced. The reason therefor is as follows.

When the potential of the plate electrode 20 varies by ΔVPL, the plate electrode 20 is used as a power supply of the bit-line precharge circuits 3. The bit-line precharge potential VBL also varied by ΔVPL. The bit-line readout voltage of equation (1) can be written as the following equation (4):

$$V\text{sense}=\{V\text{cell}+\Delta VPL-(VBL+\Delta VPL)\}\times\{Cs/(Cb+Cs)\}=(V\text{cell}-VBL)\times\{Cs/(Cb+Cs)\} \quad (4)$$

Since the bit-line precharge potential is varied in response to variations in plate potential, an influence of variations in plate potential upon the bit-line readout voltage is canceled. Therefore, even though the plate potential varies, a margin for the readout operation can be prevented from being reduced.

When the resistance of the plate electrode 20 is relatively high, a potential variation may occur locally within the same plate electrode 20. In accordance with an improvement in degree of integration, the number of memory cells connected to one plate electrode 20 is increased, and the plate potential is easy to locally vary particularly in an area remote from the plate potential generator 4. In such a case, too, the length of the bit line is about 256 cell/bit line (which means that 256 memory cells are connected to one bit line), and a memory cell to be accessed is relatively close to the bit-line precharge circuit to which the plate potential variation of the memory cell is transmitted. The bit-line precharge potential can be set almost equal to the plate potential near the memory cell to be accessed.

According to the first embodiment, the power supply wiring for precharging the bit lines need not be routed and thus the chip area of the DRAM can be decreased.

If, in general, there is a difference in precharge potential between the bit line pairs, a lag of starting timing of a sense amplifier is caused between the bit line pairs and so are variations in sense speed. Since, in the first embodiment, all the bit line pairs are varied in potential by the same and precharged according to variations in plate potential, there is no potential difference between the bit line pairs and thus no variations occur in the sense speed.

According to the first embodiment, since, furthermore, no sense operation margin is reduced even by potential variations of the plate electrode, the potential of the plate electrode need not be stabilized. In the plate potential generator 4, therefore, its performance such as a current driving performance can be decreased. Since the resistance between the plate electrode 20 and plate potential generator 4 can be increased and they can be arranged separately from each other, the degree of freedom of a pattern layout is improved. Since the resistance of wiring between the plate electrode and plate potential generator can be increased, the wiring can be thinned and constituted of the same materials as those of gate wiring and diffusion layer wiring of the transistors.

The same materials as those of the plate electrode 20 can be buried into the contact hole 24 shown in FIG. 5, or a plate electrode 20 can be formed after proper conductive materials other than those of the electrode 20 are buried into the hole 24. The same is true of the contact holes 51 to 54. The same materials as those of the bit line 16 and one electrode 18 of the capacitor C can be buried into the contact holes 51 to 54, or a bit line 16 and an electrode 18 can be formed after proper conductive materials other than those of the bit line 16 and electrode 18 are buried into the contact holes.

In the foregoing constitution of the first embodiment, the plate electrode 20 and the diffusion layer 22 of the substrate 11 directly contact each other. Therefore, the contact has to be deep and there is a possibility that it is difficult to form a contact hole 24 and bury materials thereinto.

Figure 6:
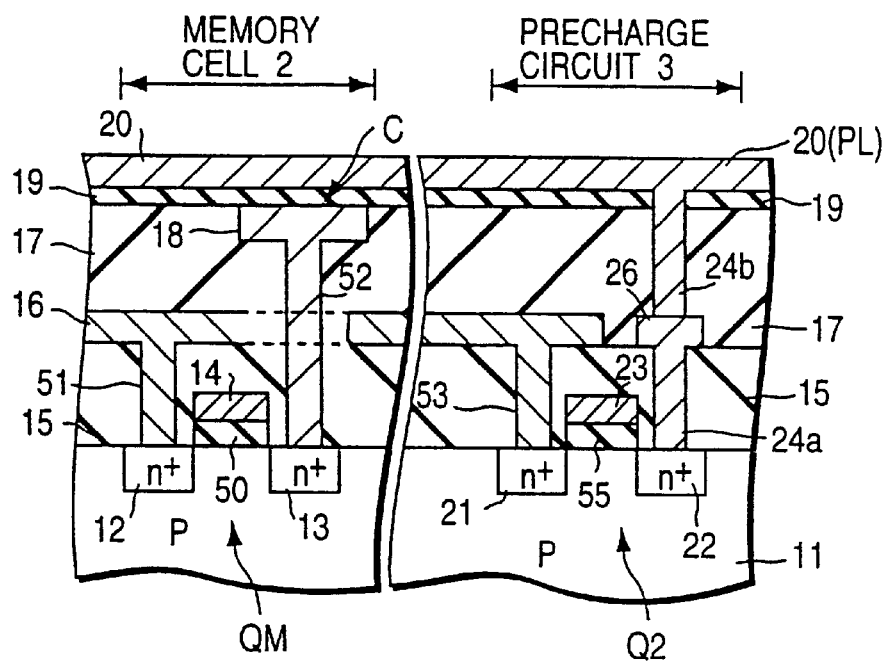
FIG. 6 is a cross-sectional view of a DRAM according to a second embodiment of the present invention, which corresponds to that of FIG. 5.

The constitution according to a second embodiment suitable for such a deep contact is shown in FIG. 6 while corresponding to the section of FIG. 5. In FIG. 6, the constituting elements corresponding to those in FIG. 5 are indicated by the same reference numerals and their detailed descriptions are omitted. As illustrated in FIG. 6, a contact hole 24a is formed in a first-level interlayer insulation film 15 to form an interconnection electrode 26 connected to an n$^+$-type impurity diffusion layer 22, and a contact hole 24b is formed in a second-level interlayer insulation film 17 to bring the plate electrode 20 into contact with the interconnection electrode 26. It is thus easy to form the contact holes 24a and 24b and bury materials into the holes, and the plate electrode 20 and interconnection electrode 26 can reliably contact each other.

If the same materials as those of the bit line 16 are used for the interconnection electrode 26, a new manufacturing step need not be added. However, other adequate interlayer wiring layer materials can be used for the interconnection electrode 26.

Figure 7:
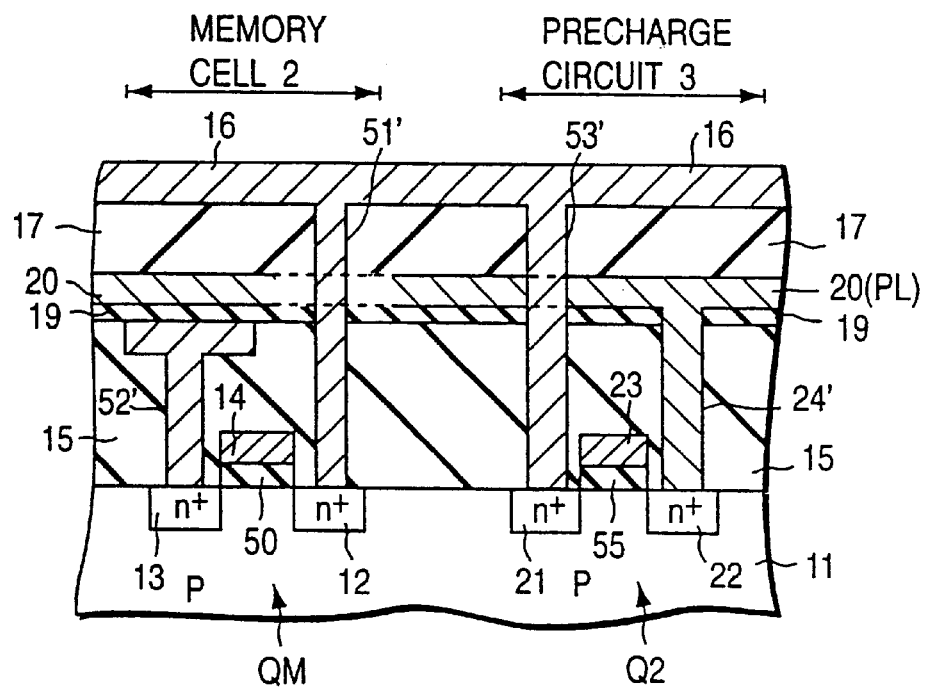
FIG. 7 is a cross-sectional view of a DRAM according to a third embodiment of the present invention, which corresponds to that of FIG. 5.

FIG. 7 illustrates a DRAM according to a third embodiment of the present invention, which is a modification to that of FIG. 5. In the third embodiment, too, a memory cell has a stacked-capacitor structure, but a storage node 18 and a plate electrode 20 are formed on a first-level interlayer insulation film 15, a second-level interlayer insulation film 17 is formed thereon, and a bit line 16 is provided on the film 17. In this embodiment, a contact hole 24' of the plate electrode 20 has only to penetrate a capacitor insulation film 19 and the first-level interlayer insulation film 15. The plate electrode 20 can thus be brought into contact with a power supply terminal ($n^+$-type impurity diffusion layer 22) of a precharge circuit 3 more easily than in FIGS. 5 and 6.

Figure 8:
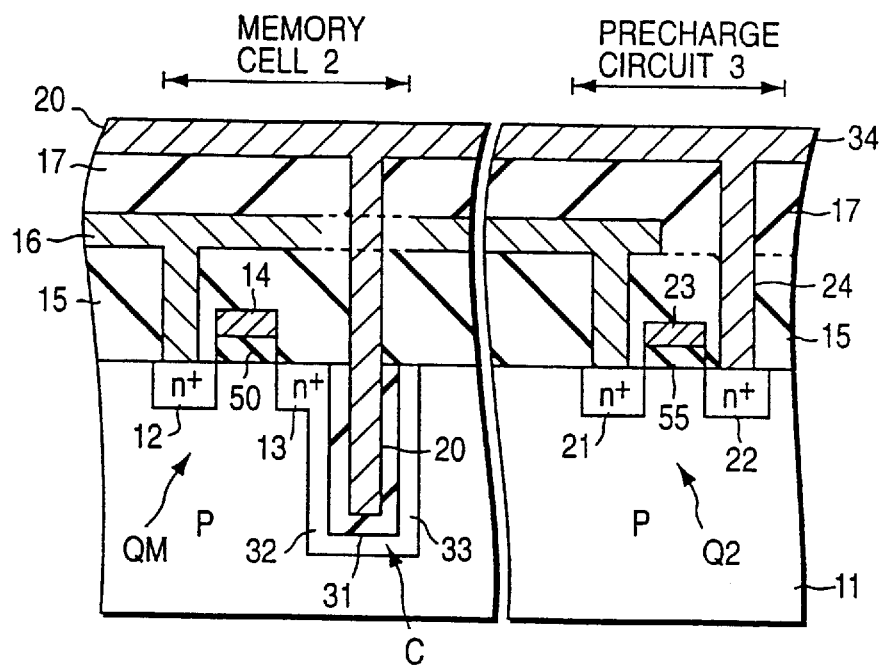
FIG. 8 is a cross-sectional view of a DRAM according to a fourth embodiment of the present invention, which corresponds to that of FIG. 5.

FIG. 8 illustrates a DRAM including memory cells each having a trench-capacitor structure according to a fourth embodiment of the present invention, which corresponds to that of FIG. 5.

In the fourth embodiment, a trench 31 is formed adjacent to a MOS transistor QM in the main surface area of a substrate 11. An $n^+$-type impurity diffusion layer 32 serving as a storage node N is formed along the outside of the trench 31 continuously with an $n^+$-type impurity diffusion layer (source) 13 of the MOS transistor QM. A capacitor insulation film 33 is formed on the inside of the trench 31, and a plate electrode 20 is buried therein to form a capacitor C for storing data. The element structure of a bit-line precharge circuit 3 is the same as that in FIG. 5.

A wiring layer 34 for applying a potential to the plate electrode 20 formed on the top of the resultant structure, is brought into contact with not only the plate electrode 20 of a trench capacitor, but also an impurity diffusion layer 22 serving as a power supply terminal of the bit-line precharge circuit 3, as in FIG. 5.

If the present invention is applied to the DRAM having a trench-capacitor structure as well as a stacked-capacitor structure, the same effects as those of the first to third embodiments can be obtained.

Figure 9:
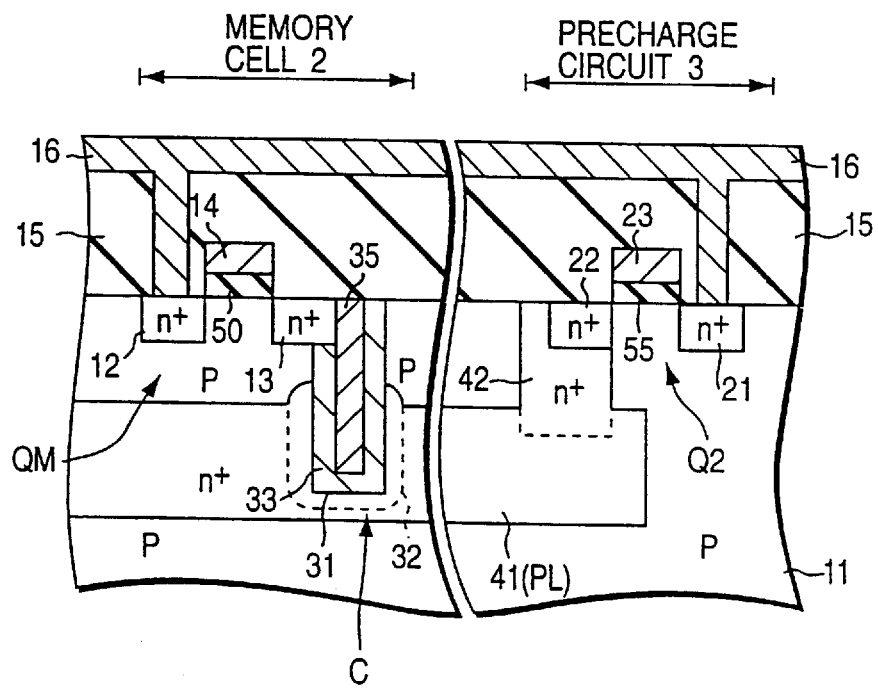
FIG. 9 is a cross-sectional view of a DRAM according to a fifth embodiment of the present invention, which corresponds to that of FIG. 5.

FIG. 9 depicts a DRAM including memory cells each having a trench-capacitor structure according to a fifth embodiment of the present invention, which corresponds to that of FIG. 8.

In the fifth embodiment, contrary to the embodiment of FIG. 8, a conductive layer 35 buried in the trench 31 is used as a storage node N. A plate electrode PL is formed by an $n^+$-type buried diffusion layer 41 formed all over the entire memory cell array inside the substrate 11, and an $n^+$-type diffusion layer 32 is formed along the trench 31 and connected to the layer 41. The layer 41 is connected to an $n^+$-type impurity diffusion layer 22, which serves as a power supply terminal of a bit-line precharge circuit 3, by means of an $n^+$-type impurity diffusion layer 42.

In order to optimize the characteristics of MOS transistors, usually, different back gate biases have to be applied to a memory cell array region and a bit-line precharge circuit region, and they are often formed in different well regions. In this case, an $n^+$-type impurity diffusion layer exposed from the major surface of the substrate 11 is used to separate p-type well regions from each other. The $n^+$-type impurity diffusion layer for separating the well regions can be used as it is for the $n^+$-type impurity diffusion layer 42. In other words, if the $n^+$-type impurity diffusion layer 22 of the MOS transistor Q2 is placed on the $n^+$-type impurity diffusion layer 42, the layer 22 is connected to the layer 41.

However, the $n^+$-type impurity diffusion layer 42 can be formed separately from the well region separating impurity diffusion layer or, if the $n^+$-type impurity diffusion layer 22 is formed away from the well region separating impurity diffusion layer, they can be connected to each other by means of a wiring layer.

The fifth embodiment has the advantage that a deep contact such as those of the first to fourth embodiments need not be formed to connect the plate electrode PL to the power supply terminal of the bit-line precharge circuit 3 because the $n^+$-type buried diffusion layer 41 is used as the plate electrode PL.

Figure 10A:
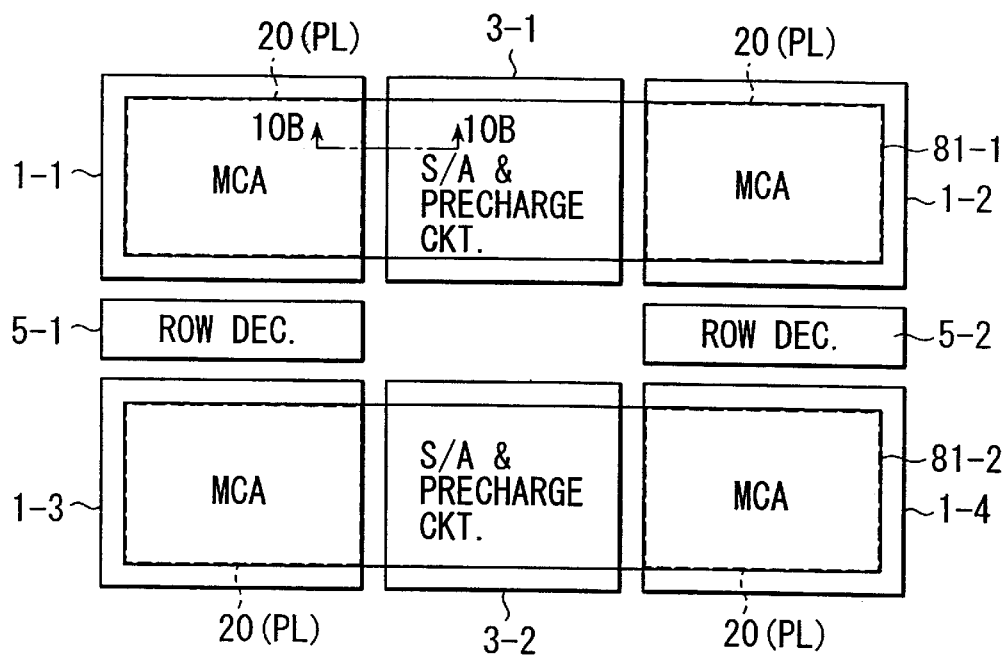
FIG. 10A is a plan view showing a pattern layout of a nearby section of a memory cell array in order to explain a DRAM according to a sixth embodiment of the present invention.
Figure 10B:
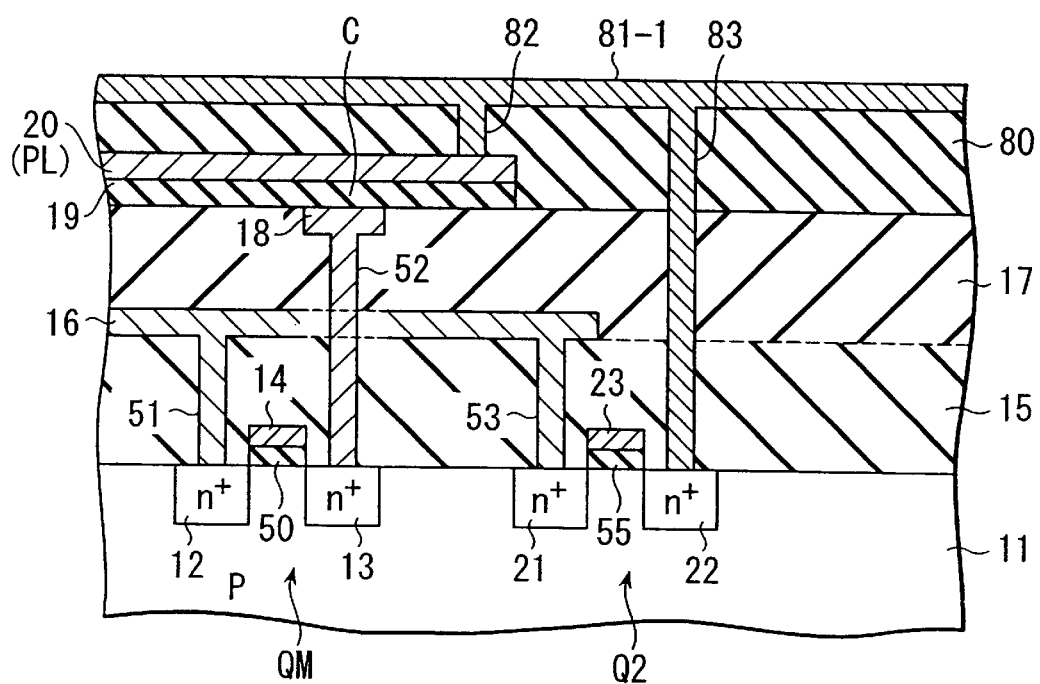
FIG. 10B is a cross-sectional view taken along line 10B—10B of FIG. 10A in order to explain the DRAM according to the sixth embodiment of the present invention.

FIGS. 10A and 10B are views shown for describing a DRAM according to a sixth embodiment of the present invention. FIG. 10A is a plan view showing a pattern layout of a nearby section of a memory cell array, while FIG. 10B is a cross-sectional view taken along line 10B—10B of FIG. 10A. FIG. 10B corresponds to the layout illustrated in FIG. 5 and the same constituting elements as those of FIG. 5 are denoted by the same reference numerals.

In the first embodiment described above, as shown in FIG. 5, the plate electrode (PL) 20 extends from a region of the memory cell 2 to that of the bit-line precharge circuit 3 and serves as a precharge potential power supply of the precharge circuit 3. In the sixth embodiment, a plate electrode (PL) 20 is formed on only each of memory cell arrays (MCA or memory cell block) 1-1, 1-2, 1-3, 1-4, . . . , as shown in FIGS. 10A and 10B. A third-level interlayer insulation film 80 is formed on the plate electrode (PL) 20, and metal wiring layers 81-1 and 81-2 are formed on the respective interlayer insulation films 80 to connect the plate electrodes (PL) 20 and sense amplifier and precharge circuits 3-1 and 3-2.

More specifically, as illustrated in FIG. 10A, a sense amplifier and precharge circuit 3-1 is arranged between adjacent memory cell arrays 1-1 and 1-2, and a sense amplifier and precharge circuit 3-2 is provided between adjacent memory cell arrays 1-3 and 1-4. A row decoder 5-1 is located between adjacent memory cell arrays 1-1 and.1-3, and another row decoder 5-2 is interposed between adjacent memory cell arrays 1-2 and 1-4. The metal wiring layer 81-1 extends from a region on the memory cell array 1-1 to a region on the memory cell array 1-2 via the sense amplifier and precharge circuit 3-1. Similarly, the metal wiring layer 81-2 extends from a region on the memory cell array 1-3 to a region on the memory cell array.1-4 via the sense amplifier and precharge circuit 3-2.

As shown in FIG. 10B, each of the memory cell arrays 1-1 to 1-4 includes memory cells having a stacked-capacitor structure. The drain and source of a MOS transistor QM in a memory cell are formed of $n^+$-type impurity diffusion layers 12 and 13 separated in a p-type silicon substrate (or a p-type well region) 11. A gate insulation film 50 of the MOS transistor and a gate electrode 14 thereof serving as a word line are formed on the substrate 11 between the diffusion layers 12 and 13. A first-level interlayer insulation film 15 is formed on the resultant semiconductor structure, and a bit line 16 is formed on the film 15. The bit line 16 is connected to the $n^+$-type impurity diffusion layer (drain) 12 through a contact hole 51 formed in the film 15. A second-level interlayer insulation film 17 is formed on the bit line 16 and interlayer insulation film 15, and one electrode 18 of a capacitor C serving as a storage node is formed on the film 17. The electrode 18 is connected to the $n^+$-type impurity diffusion layer (source) 13 through a contact hole 52 formed in the films 17 and 15. A capacitor insulation film 19 is formed on the electrode 18 and interlayer insulation film 17, and a plate electrode (PL) 20 serving as a common electrode of the plural capacitors C is provided on the capacitor insulation film 19. The plate electrode 20 is formed on each of the memory cell arrays 1-1 to 1-4, as shown in FIG. 10A.

The third-level interlayer insulation film 80 is formed on the plate electrode 20 and second-level interlayer insulation film 17. The metal wiring layers 81-1 is formed on the interlayer insulation film 80. The layer 81-1 is formed so as to cover the plate electrode (PL) 20 through the interlayer insulation film 80 between the paired memory cell arrays 1-1 and 1-2 between which the sense amplifier and precharge circuit 3-1 is sandwiched. The metal wiring layer 81-1 is connected to the plate electrode (PL) 20 through a via hole 82 and connected to an n$^+$-type impurity diffusion layer 22 serving as a source of a precharge MOS transistor Q2 through a contact hole 83.

The above structure of the sixth embodiment allows a power supply potential to be supplied from the plate electrode (PL) 20 to the bit-line precharge circuit, basically as in the foregoing embodiments. Even though a plate potential varies, a precharge potential of the bit line varies therewith and these variations act on each other in which direction they cancel out each other at a read voltage of the memory cells. A readout operation margin is not reduced and high-speed access can be achieved. Since the potential stability of the plate electrode is not needed, a low-performance plate potential generator can be used. Since, moreover, the layout of the plate potential generator or the wiring resistance between the plate potential generator and the plate electrode need not be taken into consideration, the degree of freedom of the layout is increased.

Figure 11A:
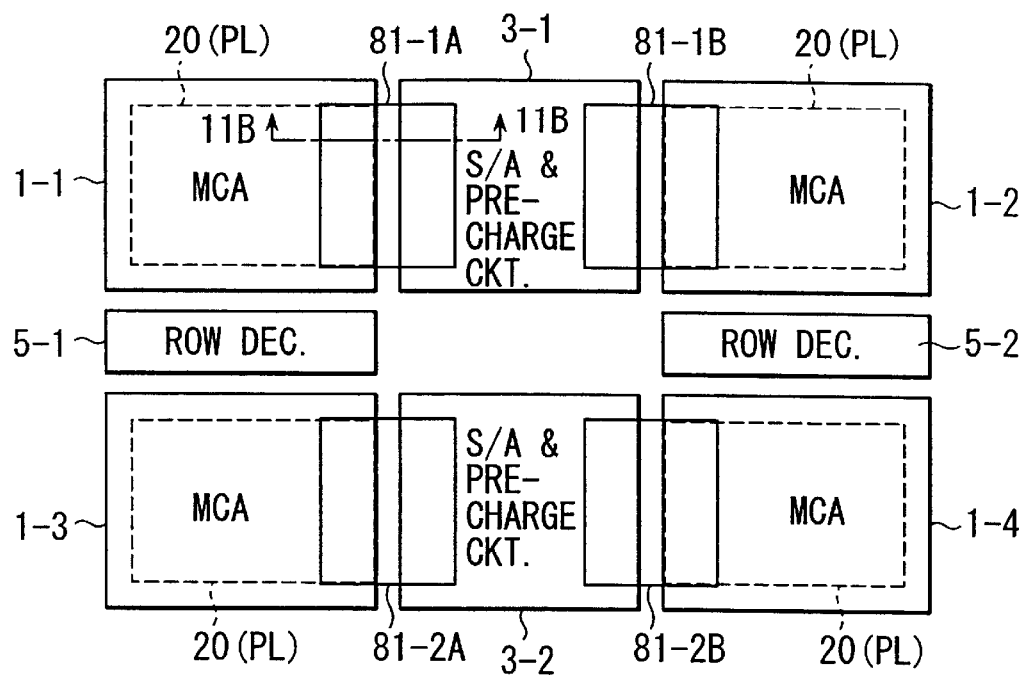
FIG. 11A is a plan view showing a pattern layout of a nearby section of a memory cell array in order to explain a DRAM according to a seventh embodiment of the present invention.
Figure 11B:
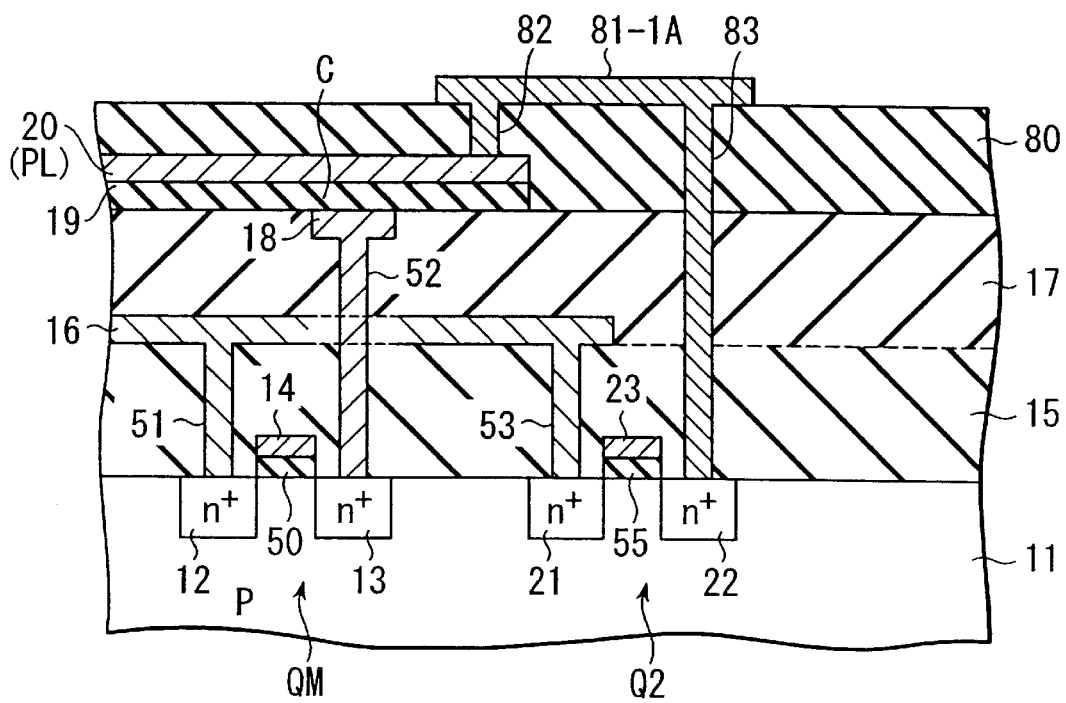
FIG. 11B is a cross-sectional view taken along line 11B—11B of FIG. 11A in order to explain the DRAM according to the seventh embodiment of the present invention.

FIGS. 11A and 11B are views shown for describing a DRAM according to a seventh embodiment of the present invention. FIG. 11A is a plan view showing a pattern layout of a nearby section of a memory cell array, while FIG. 11B is a cross-sectional view taken along line 11B—11B of FIG. 11A. FIG. 11B corresponds to the layout illustrated in FIG. 5 and the same constituting elements as those of FIG. 5 are denoted by the same reference numerals.

In a common DRAM, a region directly above a plate electrode is used to form a wiring layer in a direction perpendicular to a bit line. If, therefore, the metal wiring layers 81-1 to 81-2 are formed as in the foregoing sixth embodiment, a wiring layer is difficult to form on the memory cell arrays 1-1 to 1-4.

In the seventh embodiment, metal wiring layers 81-1A, 81-1B, 81-2A and 81-2B are provided such that they extend from some of regions of the memory cell arrays 1-1 to 1-4 to those of sense amplifier and precharge circuits 3-1 and 3-2 in order to lessen regions of metal wiring layers 81-1 and 81-2 formed on the memory cell arrays 1-1 to 1-4 and, in other words, the metal wiring layers 81-A, 81-1B, 81-2A and 81-2B are provided close to boundary regions of the memory cell arrays 1-1 to 1-4 and the sense amplifier and precharge circuits 3-1 and 3-2. Therefore, the metal wiring layers 81-1A, 8-1-1B, 81-2A and 81-2B required for connecting a plate electrode (PL) 20 and a bit-line precharge circuit can be decreased in width, and metal wiring layers constituted of the same layers as the metal wiring layers 81-1A, 81-1B, 81-2A and 81-2B can be formed on the memory cell arrays 1-1 to 1-4. The degree of freedom of the wiring can thus be increased.

Figure 12A:
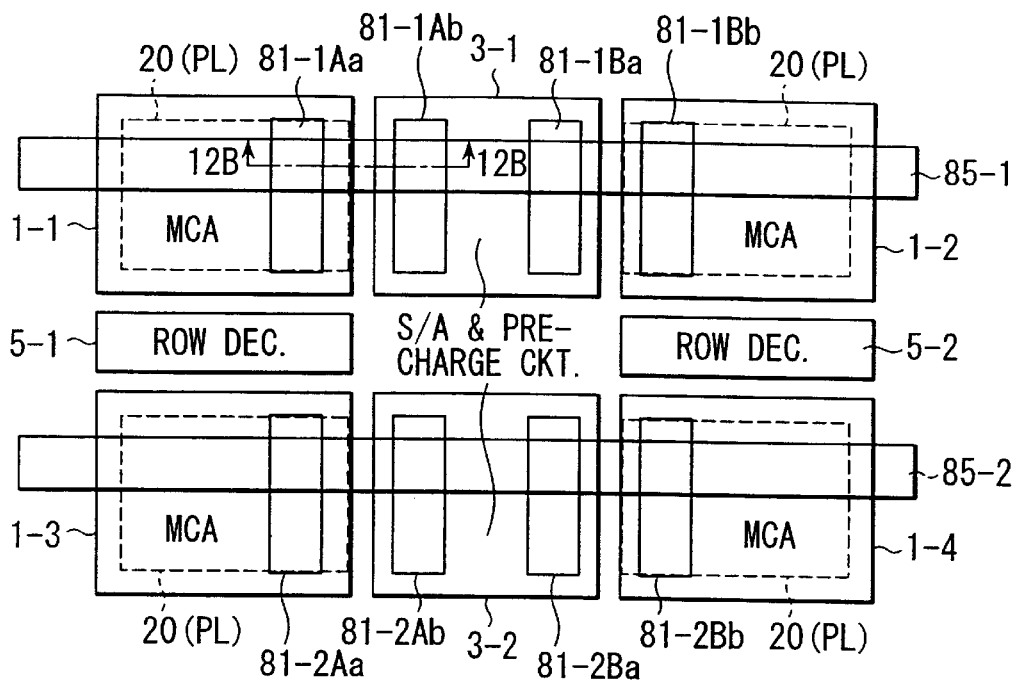
FIG. 12A is a plan view showing a pattern layout of a nearby section of a memory cell array in order to explain a DRAM according to an eighth embodiment of the present invention.
Figure 12B:
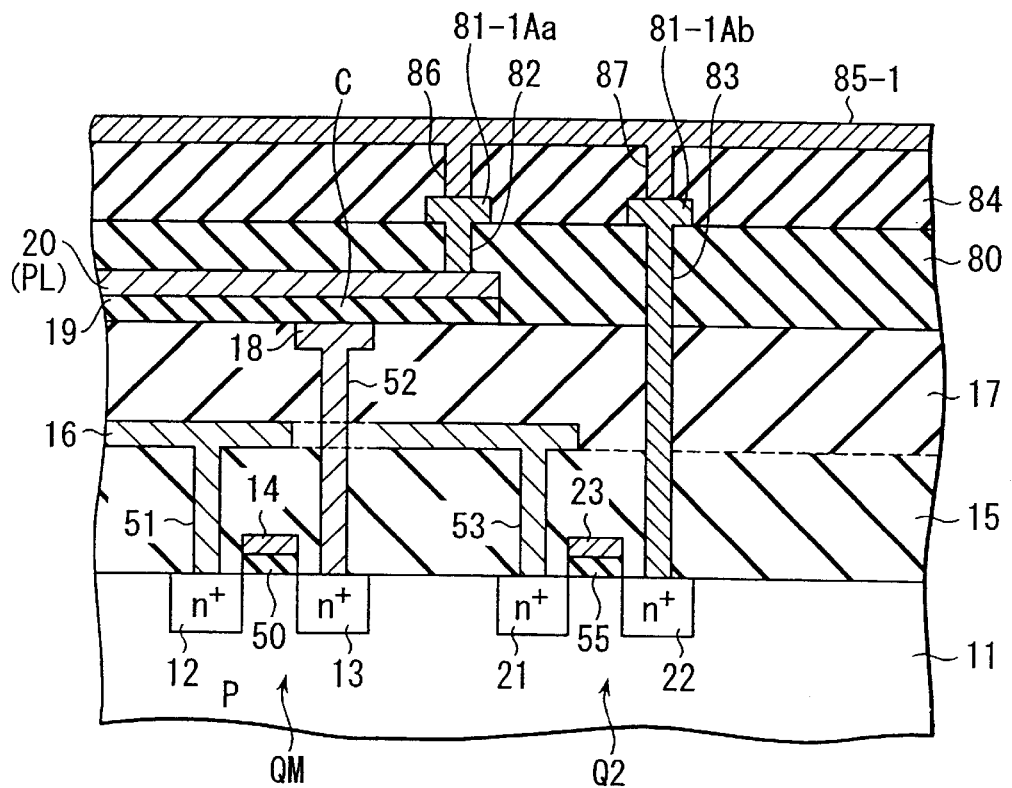
FIG. 12B is a cross-sectional view taken along line 12B—12B of FIG. 12A in order to explain the DRAM according to the eighth embodiment of the present invention.

FIGS. 12A and 12B are views shown for describing a DRAM according to an eighth embodiment of the present invention. FIG. 12A is a plan view showing a pattern layout of a nearby section of a memory cell array, while FIG. 12B is a cross-sectional view taken along line 12B-12B of FIG. 12A. FIG. 12B corresponds to the layout illustrated in FIG. 5 and the same constituting elements as those of FIG. 5 are denoted by the same reference numerals.

In the sixth and seventh embodiments described above, the metal wiring layers 81-1 and 81-2 or 81-1A, 81-1B, 81-2A and 81-2B, which are connected to the plate electrodes (PA) 20, have to extend onto the sense amplifier and precharge circuits 3-1 and 3-2. In a shared sense amplifier, a sense amplifier as well as a bit-line precharge circuit is provided between memory cell arrays 1-1 and 1-2 and between memory cell arrays 1-3 and 1-4. If the plate electrode (PL) 20 is caused to pass on the sense amplifier, noise is generated during the operation of the sense amplifier and added to the plate electrode (PL) 20; accordingly, there is a possibility that a readout margin will decrease.

According to the eight embodiment, another metal wiring layer is provided on the above-described metal wiring layers considering a decrease in readout margin due to noise caused when a sense amplifier operates.

As has been described above with reference to the sixth embodiment, in a normal DRAM, a region directly above a plate electrode serves to form a wiring layer in a direction perpendicular to a bit line, and a metal wiring layer is formed on the region along a direction parallel to the bit line. As illustrated in FIGS. 12A and 12B, metal wiring layers 81-1$a$, 81-1A$b$, 81-1B$a$, 81-1B$b$, 81-2A$a$, 81-2A$b$, 81-2B$a$ and 81-2B$b$ are provided on the regions on memory cell arrays 1-1 to 1-4 and those on sense amplifier and bit line precharge circuits 3-1 and 3-2. These metal wiring layers are so patterned that their longitudinal direction is perpendicular to a bit line 16. A fourth-level interlayer insulation film 84 is formed on the above metal wiring layers 81-1A$a$, 81-1A$b$, 81-1B$a$, 81-1B$b$, 81-2A$a$, 81-2A$b$, 81-2B$a$ and 81-2B$b$ and the above third-level interlayer insulation film 80. Via holes 86 and 87 are formed on the metal wiring layers 81-1A$a$ and 81-1A$b$ of the interlayer insulation film 84, respectively. A metal wiring layer 85-1 is formed on the film 84 and connected to the metal wiring layer 81-1A$a$ through the via hole 86 and to the metal wiring layer 81-1A$b$ through the via hole 87. The plate electrode (PL) 20 is thus electrically connected to the source of a precharge transistor Q2. As illustrated in FIG. 12A, the above metal wiring layers 85-1 and 85-2 are so patterned that their longitudinal direction is perpendicular-to the metal wiring layers 81-1A$a$, 81-1A$b$, 81-1B$a$, 81-1B$b$, 81-2A$a$, 81-2A$b$, 81-2B$a$ and 81-2B$b$ or the same as that of the bit line.

In the eighth embodiment, the plate electrode (PL) 20 does not pass on the sense amplifier. Even in the shared sense amplifier, noise generated during the operation of the sense amplifier can be inhibited from being added to the plate electrode (PL) 20 and a readout margin can be prevented from lowering. Moreover, the noise elimination effect between adjacent memory cell arrays can be obtained as in the sixth and seventh embodiments described above.

In the eighth embodiment, however, the plate electrode and bit-line precharge circuit are connected to each other by means of the metal wiring layers 85-1 and 85-2 in one memory cell array, so that the noise elimination effect is slightly lessened in a memory cell array. The structures of the sixth and seventh embodiments can selectively been employed in accordance with a required noise elimination effect.

Figure 13A:
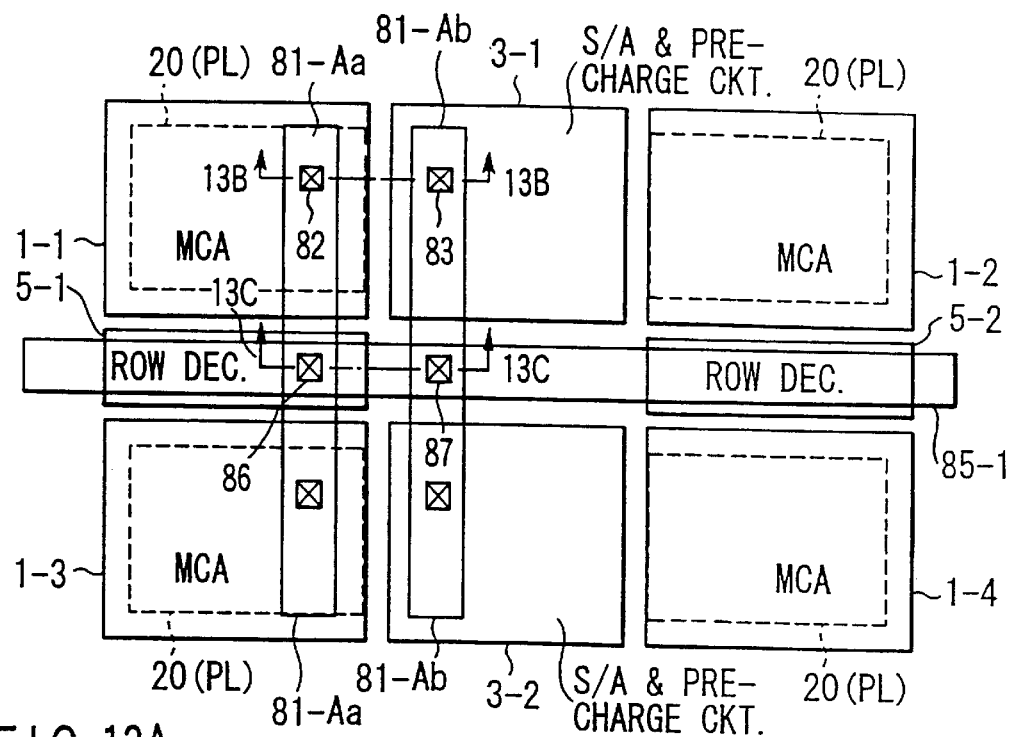
FIG. 13A is a plan view showing a pattern layout of a nearby section of a memory cell array in order to explain a modification to the DRAM according to the eighth embodiment of the present invention.
Figure 13B:
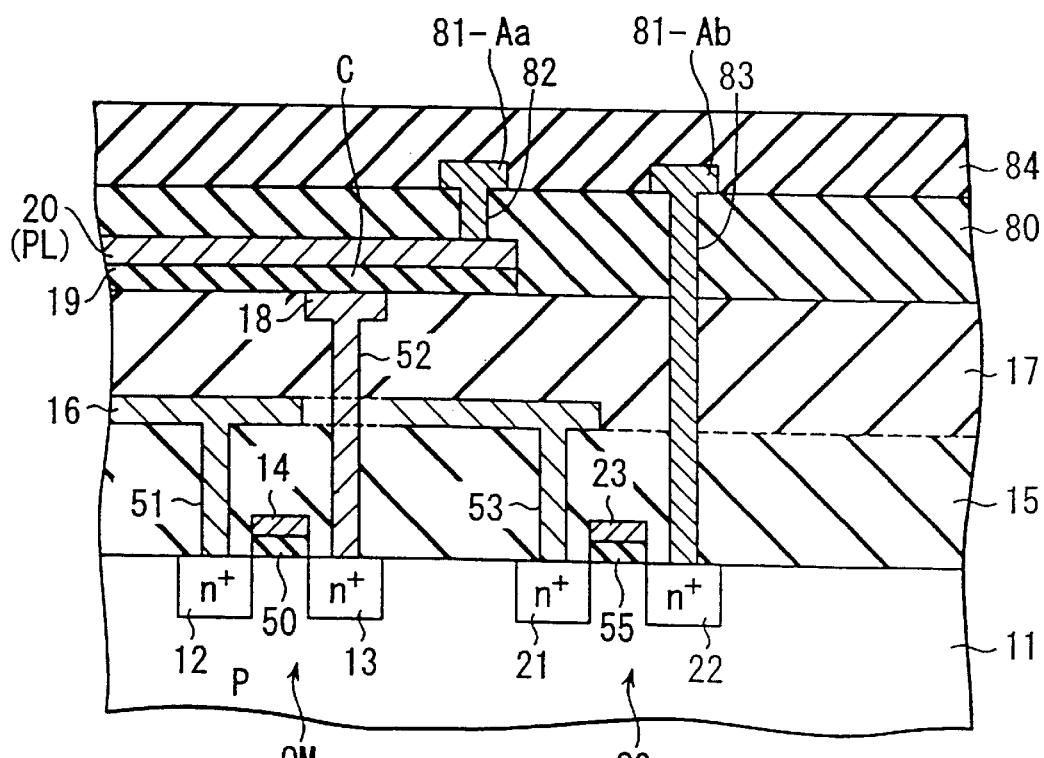
FIG. 13B is a cross-sectional view taken along line 13B—13B of FIG. 13A in order to explain the modification to the DRAM according to the eighth embodiment of the present invention.

The number of wiring layers on the memory cell arrays 1-1 to 1-4 can be reduced if the metal wiring layer 85-1 is arranged on the row decoders 5-1 and 5-2 as shown in FIGS. 13A to 13C. In other words, the metal wiring layer 85-1 is formed on the region where the row decoders 5-1 and 5-2 are formed and connected to the metal wiring layer 81-A$a$ through the via hole 86 on the region where the row decoder 5-1 is formed. The metal wiring layer 85-1 is also connected to the metal wiring layer 81-A$b$ through the via hole 87 at the intersections of the row decoders and the sense amplifiers. This arrangement produces the same effects as those of the arrangement-shown in FIGS. 12A and 12B and makes it possible to reduce the number of wiring layers on the memory cell arrays 1-1 to 1-4.

Figure 14A:
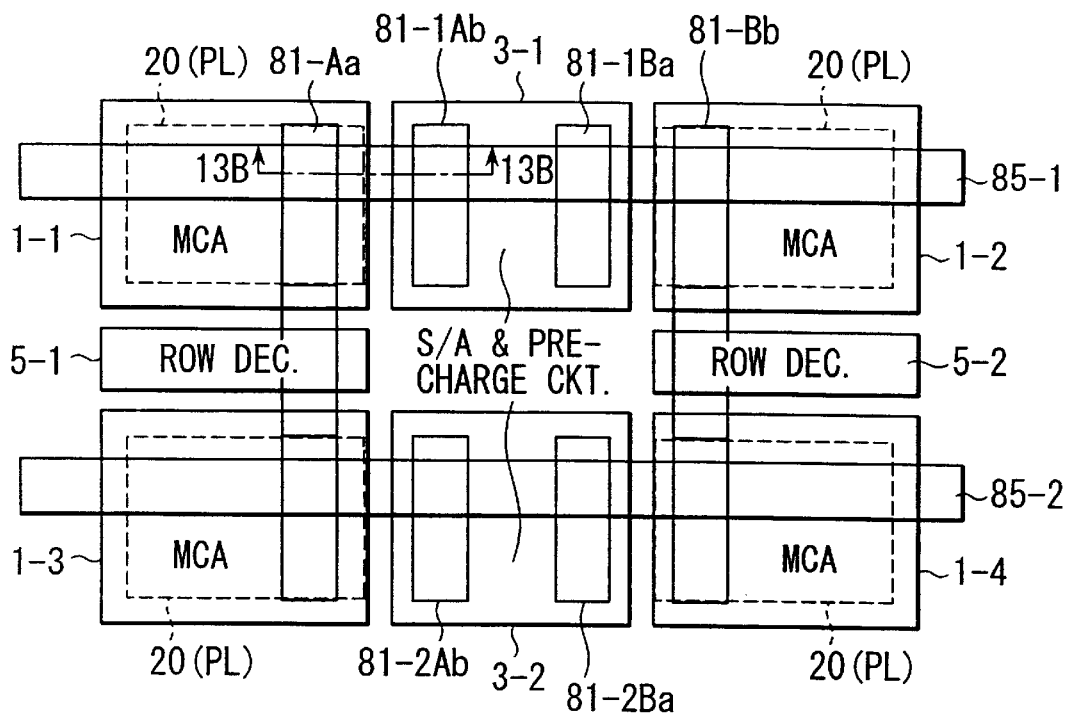
FIG. 14A is a plan view showing a pattern layout of a nearby section of a memory cell array in order to explain a DRAM according to a ninth embodiment of the present invention.
Figure 14B:
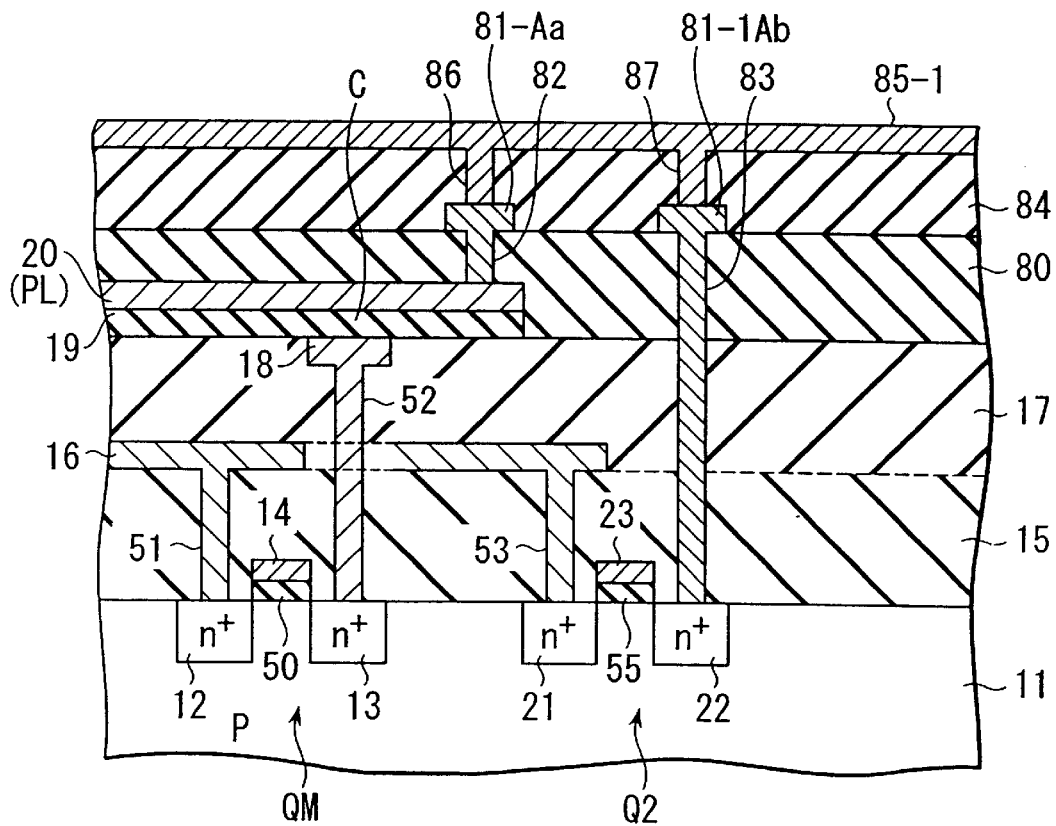
FIG. 14B is a cross-sectional view taken along line 13B—13B of FIG. 14A in order to explain the DRAM according to the ninth embodiment of the present invention.

When the resistance of the metal wiring layers 81-1A$a$, 81-1A$b$, 81-1B$a$, 81-1B$b$, 81-2A$a$, 81-2A$b$, 81-2B$a$ and 81-2B$b$ is high, it is preferable as shown in FIGS. 14A and 14B to provide both a metal wiring layer 81-A$a$ connected to the metal wiring layers 81-1A$a$ and 81-2A$a$ of adjacent memory cell arrays 1-1 and 1-3 between which a row decoder 5-1 is interposed and a metal wiring layer 81-B$b$ connected to the metal wiring layers 81-1B$b$ and 81-2B$b$ of adjacent memory cell arrays 1-2 and 1-4 between which a row decoder 5-2 is interposed. These metal wiring layers 81-A$a$ and 81-B$b$ increase the number of charging paths and allows the charging speed to increase at power-on. Noise of adjacent memory cell arrays is difficult to transmit because the resistance of the metal wiring layers 81-A$a$ and 81-B$b$ is high.

When the resistance of the metal wiring layers is low, noise of adjacent memory cell arrays is not transmitted. As shown in FIGS. 12A and 12B, it is therefore better to separate the wiring layers 81-1A$a$ and 81-2A$a$ from each other and separate the wiring layers 81-1B$b$ and 81-2B$b$ from each other.

Figure 15:
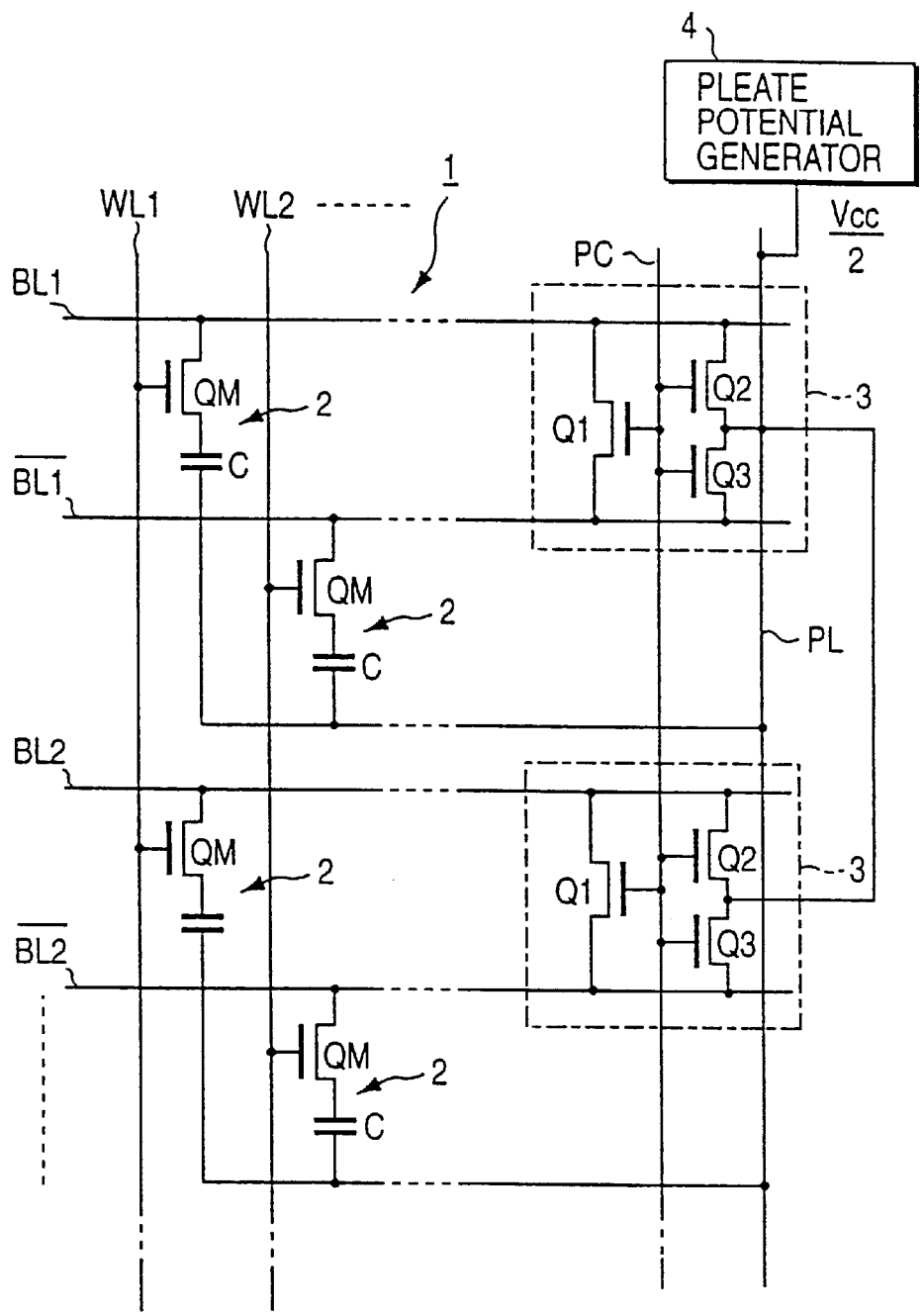
FIG. 15 is an equivalent circuit diagram illustrating the main part of a DRAM according to a tenth embodiment of the present invention.

FIG. 15 is an equivalent circuit diagram of the major part of a DRAM according to a tenth embodiment of the present invention. In the foregoing first to ninth embodiments, a plate potential of each of bit line pairs BL1 and $\overline{BL1}$, BL2 and $\overline{BL2}$, . . . is applied to a bit-line precharge circuit 3 connected thereto. In the tenth embodiment, however, a plate potential of one bit line pair is applied to adjacent bit-line precharge circuits 3 (two in FIG. 15). The number of bit-line precharge circuits to which a plate potential of one bit line pair is applied, has only to be set properly when necessary.

Basically the DRAM having such a circuit arrangement performs the same operation as that of the first embodiment and creates the same effect.

Figure 16:
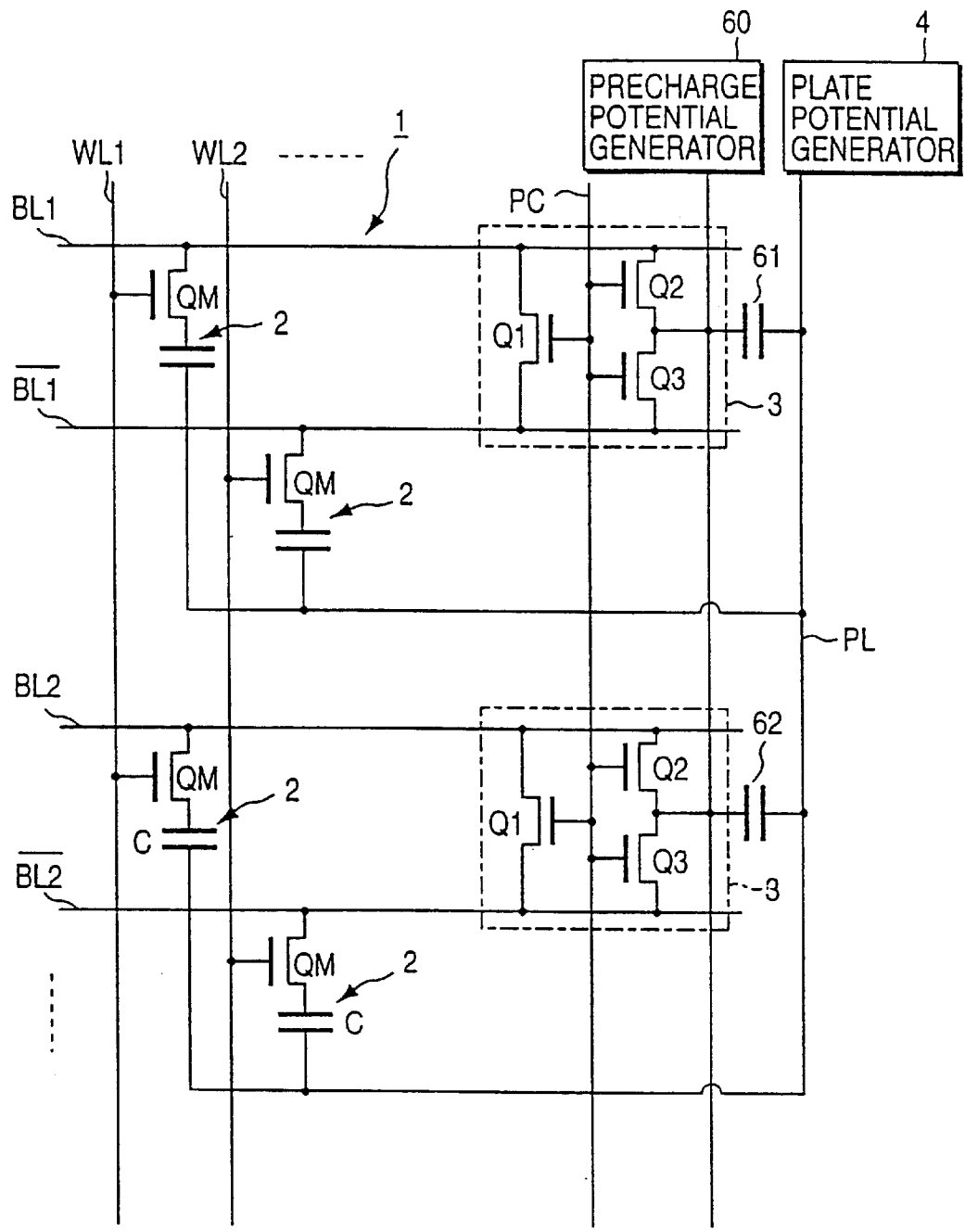
FIG. 16 is an equivalent circuit diagram illustrating the main part of a DRAM according to an eleventh embodiment of the present invention.

FIG. 16 is an equivalent circuit diagram of the major part of a DRAM according to an eleventh embodiment of the present invention. In the above first to tenth embodiments, the output potential of the bit-line precharge potential generator and that of the plate potential generator 4 are the same (e.g., Vcc/2), or the output potential of the plate potential generator 4 is applied to the bit-line precharge circuit 3. In the eleventh embodiment, the output potential of the precharge potential generator 60 and that of the plate potential generator 4 are different from each other. In other words, in the seventh embodiment, the plate electrode PL is coupled to the bit-line precharge circuits 3 via capacitors 61, 62, . . . to transmit not DC components (potential difference) of the plate electrode PL but AC components (variations) to the bit-line precharge circuits 3.

With the above-described arrangement, the same advantage as that of the first embodiment can be obtained even though the output potentials of both the precharge potential generator 60 and plate potential generator 4 are different, for example, when the former is Vcc and the latter is Vss.

Figure 17:
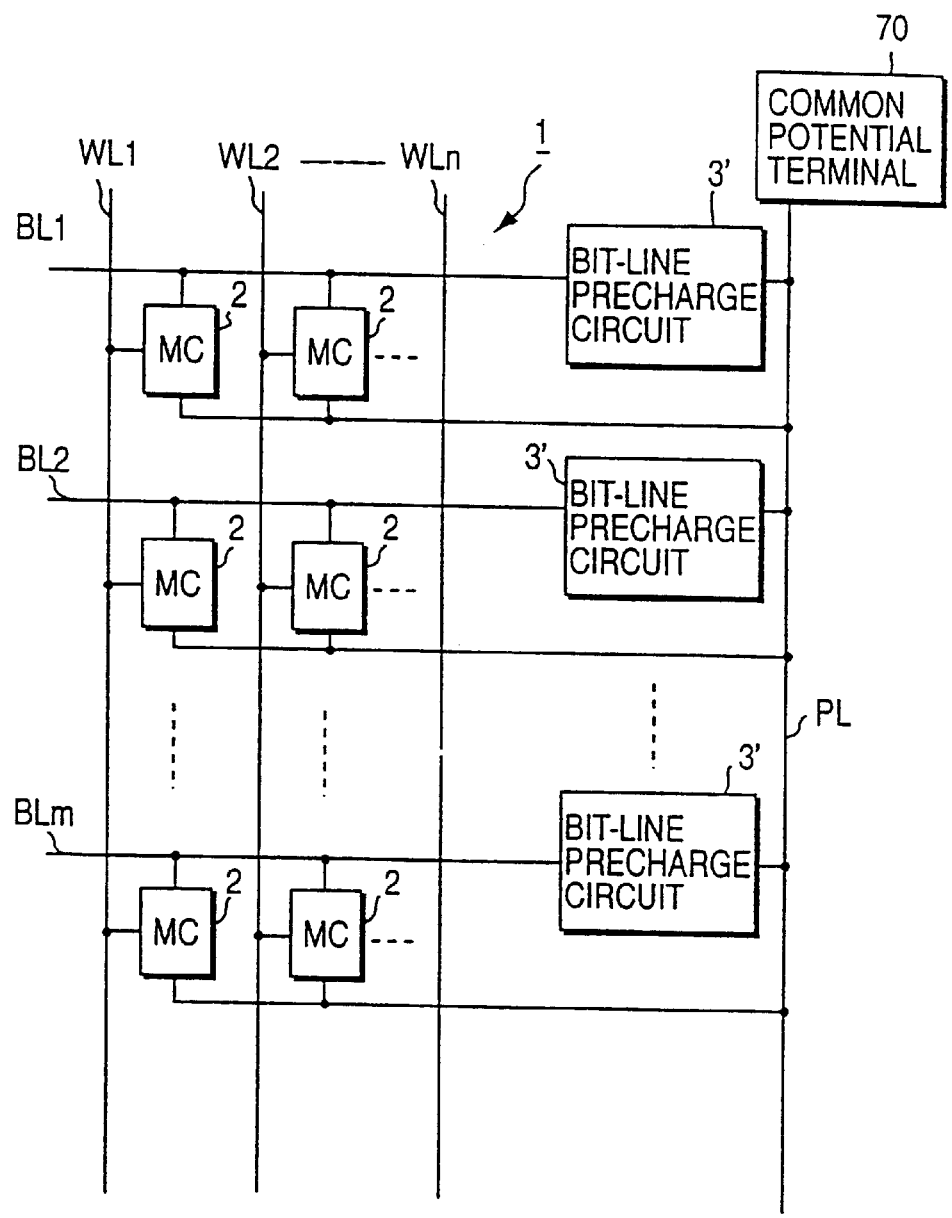
FIG. 17 is an equivalent circuit diagram illustrating the main part of a DRAM according to a twelfth embodiment of the present invention.

FIG. 17 is an equivalent circuit diagram of the major part of a DRAM according to a twelfth embodiment of the present invention. In the above first to eleventh embodiments, the memory cell array 1 includes the bit line pairs BL1 and $\overline{BL1}$, BL2 and $\overline{BL2}$, . . . ; however, the DRAM of the eighth embodiment has a single bit line structure.

More specifically, a memory cell array 1 of the DRAM of the eighth embodiment includes bit lines BL1, BL2, . . . , BLm, word lines WL1, WL2, . . . , WLn, and dynamic memory cells (MC) 2. The bit lines and word lines cross each other, and the memory cells 2 are arranged at their respective intersections thereof. Like the circuit shown in FIG. 3, each of the memory cells 2 includes a MOS transistor for data transfer and a capacitor for data storage. The drain of the MOS transistor is connected to its corresponding one of bit line BL1, BL2, . . . , BLm, the source thereof is connected to one electrode of the capacitor, and the gate thereof is connected to its corresponding one of word lines WL1, WL2, . . . , WLn. The other electrode of the capacitor is connected to the plate electrode PL.

The bit-line precharge circuits 3' are each provided at one end of a corresponding one of bit lines BL1, BL2, . . . , BLm. The plate electrode PL of the plural capacitors C (included in the memory cells 2 connected to the bit line provided with the bit-line precharge circuit 3'). A reference potential is applied from the common potential terminal 70 to the plate electrode PL. The reference potential is therefore applied to the bit-line precharge circuits 3', and a potential variation of the plate electrode PL of the bit line to which a bit-line precharge circuit 3' is connected, is transmitted to the bit-line precharge circuits 3'.

An output potential of a reference potential generator or a plate potential generator provided inside the DRAM chip can be applied to the common potential terminal 70, or a reference potential can be applied thereto from outside the chip.

As described above, basically, even the DRAM having a single bit line structure performs the same operation as that of the first to eleventh embodiments and produces the same effect.

In the aforementioned first to twelfth embodiments, all the MOS transistors for data transfer in the memory cells and all the MOS transistors in the bit-line precharge circuits are of an N-channel type. However, it is needless to say that the present invention is effective even when P-channel MOS transistors are used. Furthermore, the above embodiments are directed to a Vcc/2 precharge type DRAM; however, they can be applied to a Vcc precharge type DRAM, too.

According to the foregoing DRAM of the present invention, since the output potential of a bit-line precharge circuit can be varied in response to (in proportion to) potential variations of the plate electrode, an influence of noise on the plate electrode can be reduced, and a margin for readout operations is not reduced even by row access for switching the word lines at high speed. Since, moreover, the plate electrode has only to be directly connected to the power supply terminal of a bit-line precharge-circuit through a contact hole, the power supply wiring of the bit-line precharge circuit need not be routed and thus the chip area can be utilized effectively. Since, furthermore, the potential of the plate electrode need not be stabilized, a high-performance plate potential generator is not required, and the layout of the plate potential generator or the wiring resistance between the plate potential generator and plate electrode need not be taken into consideration, thereby improving the degree of freedom of the layout.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a semiconductor substrate;

a memory cell array formed in said semiconductor substrate, said memory cell array including bit lines and word lines crossing each other and memory cells arranged at intersections of the bit lines and the word lines and each having a transistor and a capacitor, said capacitor being formed on an interlayer insulation film that covers both said transistor and bit-line precharge circuits, and including a first electrode electrically connected through the interlayer insulation film to an impurity diffusion layer of the transistor and serving as a storage node, a capacitor insulation film formed on the first electrode, and a second electrode arranged on the capacitor insulation film;

bit-line precharge circuits formed in said semiconductor substrate, to precharge the bit lines; and a plate electrode serving as the second electrode of each capacitor of the memory cells, extending from an area where the memory cell array is formed to an area where the bit-line precharge circuits are formed, and applying a power supply potential to said bit-line precharge circuits, said plate electrode being electrically connected to an impurity diffusion layer through a contact hole in the area where the bit-line precharge circuits are formed, said impurity diffusion layer serving as the power supply terminal of the bit-line precharge circuits, and said contact hole being formed through both the capacitor insulation film and the interlayer insulation film.

2. The semiconductor memory device according to claim 1, wherein said plate electrode is connected to power supply terminals of said bit-line precharge circuits.

3. The semiconductor memory device according to claim 1, wherein the capacitors of the memory cells each have a stacked structure.

4. The semiconductor memory device according to claim 1, wherein the capacitors of the memory cells each have a trench structure.

5. The semiconductor memory device according to claim 1, wherein said bit-line precharge circuits precharge the bit lines at a potential which is in proportion to a potential of said plate electrode.

6. The semiconductor memory device according to claim 1, wherein the capacitors are formed on an interlayer insulation film covering transistors of the memory cells and the bit-line precharge circuits, and each includes a first electrode connected to an impurity diffusion layer of the transistor of a memory cell through the interlayer insulation film and serving as a storage node, a capacitor insulation film formed on the first electrode, and a second electrode formed on the capacitor insulation film and serving as said plate electrode; and said plate electrode is connected to an impurity diffusion layer serving as power supply terminals of the bit-line precharge circuits via a contact hole formed through the capacitor insulation film and the interlayer insulation film.

7. The semiconductor memory device according to claim 1, further comprising a plate potential generator formed in said semiconductor substrate on which said memory cells are formed, to apply a plate potential to power supply terminals of said bit-line precharge circuits.

8. The semiconductor memory device according to claim 1, further comprising a plate potential generator formed outside said semiconductor substrate on which the memory cells are formed, to apply a plate potential to power supply terminals of said bit-line precharge circuits.

9. The semiconductor memory device according to claim 1, further comprising:

a precharge potential generator to generate a precharge potential to apply the precharge potential to power supply terminals of said bit-line precharge circuits;

a plate potential generator to generate a plate potential other than the precharge potential to apply the plate potential to the plate electrode; and capacitors each connected between the plate electrode and each of said bit-line precharge circuits.

10. The semiconductor memory device according to claim 9, wherein said bit lines are constituted of bit line pairs, each of said bit-line precharge circuits is provided for each of the bit line pairs, and each of the capacitors is provided for each of said bit-line precharge circuits.

11. A semiconductor memory device comprising:

a semiconductor substrate;

a memory cell array formed in said semiconductor substrate, said memory cell array including bit lines and word lines crossing each other and memory cells arranged at intersections of the bit lines and the word lines and each having a transistor and a capacitor, said capacitor including a first electrode constituted of an impurity diffusion layer formed along a side wall and a bottom of a trench continuously with an impurity diffusion layer of the transistor and serving as a storage node, said trench being formed on a major surface of said semiconductor substrate adjacent to the transistor of each of said memory cells; a capacitor insulation film formed in the trench; and a second electrode buried into the trench with the capacitor insulation film interposed therebetween;

bit-line precharge-circuits formed in said semiconductor substrate, to precharge the bit-lines;

a plate electrode serving as the second electrode of each capacitor of the memory cells and formed on an interlayer insulation film that covers both the transistor of the memory cells and the capacitor in the area where the memory cell array is formed; and a wiring layer electrically connected to the plate electrode and connected to the impurity diffusion layer in the area where the bit-line precharge circuits are formed, said impurity diffusion layer serving as a power supply terminal of the bit-line precharge circuits, and said wiring layer being connected to the impurity diffusion layer through a contact hole formed in the interlayer insulation film.

12. The semiconductor memory device according to claim 11, further comprising a plate potential generator formed in said semiconductor substrate on which said memory cells are formed, to apply a plate potential to power supply terminals of said bit-line precharge circuits.

13. The semiconductor memory device according to claim 11, further comprising:

a precharge potential generator to generate a precharge potential to apply the precharge potential to power supply terminals of said bit-line precharge circuits;

a plate potential generator to generate a plate potential other than the precharge potential to apply the plate potential to the plate electrode; and capacitors each connected between the plate electrode and each of said bit-line precharge circuits.

14. The semiconductor memory device according to claim 13, wherein said bit lines are constituted of bit line pairs, each of said bit-line precharge circuits is provided for each of the bit line pairs, and each of the capacitors is provided for each of said bit-line precharge circuits.

15. A semiconductor memory device comprising:

a semiconductor substrate;

a memory cell array formed in said semiconductor substrate, said memory cell array including bit lines and word lines crossing each other and memory cells arranged at intersections of the bit lines and the word lines and each having a transistor and a capacitor, said capacitor including an impurity diffusion layer serving as a first electrode and formed along a side wall and a bottom of a trench, said trench being formed on a major surface of said semiconductor substrate adjacent to the transistor of each of said memory cells; a capacitor insulation film formed in the trench; and a second electrode buried into the trench with the capacitor insulation film interposed therebetween and electrically connected to an impurity diffusion layer of the transistor to serve as a storage node;

bit-line precharge circuits formed in said semiconductor substrate, to precharge the bit-lines;

a plate electrode extending from an area where the memory cell array is formed to an area where the bit-line precharge circuits are formed, and being for applying a power supply potential to said bit-line precharge circuits, said plate electrode being formed of a buried diffusion layer arranged inside the semiconductor substrate and being electrically connected to the first electrode of the capacitor, said plate electrode being also connected to an impurity diffusion layer serving as the power supply terminal of the bit-line precharge circuits.

16. The semiconductor memory device according to claim 15, further comprising a plate potential generator formed in said semiconductor substrate on which said memory cells are formed, to apply a plate potential to power supply terminals of said bit-line precharge circuits.

17. The semiconductor memory device according to claim 15, further comprising:

a precharge potential generator to generate a precharge potential to apply the precharge potential to power supply terminals of said bit-line precharge circuits;

a plate potential generator to generate a plate potential other than the precharge potential to apply the plate potential to the plate electrode; and capacitors each connected between the plate electrode and each of said bit-line precharge circuits.

18. The semiconductor memory device according to claim 17, wherein said bit lines are constituted of bit line pairs, each of said bit-line precharge circuits is provided for each of the bit line pairs, and each of the capacitors is provided for each of said bit-line precharge circuits.

19. A semiconductor memory device comprising:

bit lines;

word lines crossing said bit lines;

memory cells arranged at intersections of said bit lines and said word lines, said memory cells including a plurality of capacitors to which a plate electrode is connected in common;

an insulation film formed on the plate electrode;

a bit-line precharge circuit for precharging said bit lines; and a wiring layer formed on said insulation film and electrically connected to said plate electrode and a power supply terminal of said bit-line precharge circuit.

20. The semiconductor memory device according to claim 19, wherein said wiring layer is a single metal layer and directly connected to said plate electrode and the power supply terminal of said bit-line precharge circuit.

21. The semiconductor memory device according to claim 19, wherein said wiring layer extends from above a first memory cell array onto a second memory cell array adjacent to the first memory cell array, a region with said bit-line precharge circuit being interposed between the first memory cell array and the second memory cell array.

22. The semiconductor memory device according to claim 19, wherein said wiring layer is formed on a boundary region between a region with a memory cell array and the region with said bit-line precharge circuit.

23. The semiconductor memory device according to claim 19, wherein said wiring layer is connected to said plate electrode through a via hole near the region with said bit-line precharge circuit in a memory cell array.

24. The semiconductor memory device according to claim 19, wherein said wiring layer is connected to the power supply terminal of said bit-line precharge circuit through a contact hole formed in said insulation film near a memory cell array in the region with said bit-line precharge circuit.

25. The semiconductor memory device according to claim 19, wherein said wiring layer is connected to said plate electrode through a via hole near the region with said bit-line precharge circuit in a memory cell array and connected to the power supply terminal of said bit-line precharge circuit through a contact hole formed in said insulation film near a memory cell array in the region with said bit-line precharge circuit.

26. The semiconductor memory device according to claim 19, wherein said plate electrode extends from above a memory cell array to a vicinity of the region with said bit-line precharge circuit.

27. A semiconductor memory device comprising:

bit lines;

word lines crossing said bit lines;

memory cells arranged at intersections of said bit lines and said word lines, said memory cells including a plurality of capacitors to which a plate electrode is connected in common;

a first insulation film formed on the plate electrode;

a bit-line precharge circuit for precharging said bit lines;

a first wiring layer formed on said first insulation film along a direction crossing said bit lines, said first wiring layer being connected to said plate electrode through a first via hole located on said plate electrode of said first insulation film;

a second wiring layer formed on said first insulation film along a direction crossing said bit lines, said second wiring layer being connected to a power supply terminal of said bit-line precharge circuit through a contact hole located on said bit-line precharge circuit of said first insulation film;

a second insulation film formed on said first wiring layer, said second wiring layer, and said first insulation film; and a third wiring layer formed on said second insulation film along a direction which is equal to that of said bit lines, said third wiring layer being connected to said first wiring layer through a second via hole formed in said second insulation film and said second wiring layer through a third via hole formed in said second insulation film.

28. The semiconductor memory device according to claim 27, wherein said first wiring layer is formed near a region with said bit-line precharge circuit on a memory cell array.

29. The semiconductor memory device according to claim 27, wherein said first wiring layer are formed on and between adjacent memory cell arrays and above a row decoder interposed between the memory cell arrays.

30. The semiconductor memory device according to claim 27, wherein said first wiring layer is formed near a region with said bit-line precharge circuit on the memory cell arrays.

31. The semiconductor memory device according to claim 29, wherein said second wiring layer is formed near a memory cell array on a region with said bit-line precharge circuit.

32. The semiconductor memory device according to claim 27, wherein said third wiring layer is connected to said first wiring layer through said second via hole near a region with said bit-line precharge circuit in a memory cell array.

33. The semiconductor memory device according to claim 27, wherein said third wiring layer is connected to said second wiring layer through said third via hole near a memory cell array in a region with said bit-line precharge circuit.

34. The semiconductor memory device according to claim 27, wherein said third wiring layer is connected to said first wiring layer through said second via hole near a region with said bit-line precharge circuit in a memory cell array and connected to said second wiring layer through said third via hole near the memory cell array in a region with said bit-line precharge circuit.

35. The semiconductor memory device according to claim 27, wherein said third wiring layer is formed on a region where a row decoder is formed and connected to the first wiring layer through the second via hole on the region where the row decoder is formed, and the third wiring layer is connected to the second wiring layer through the third via hole at intersections of row decoders and sense amplifiers.

* * * * *

UNITED STATES PATENT AND TRADEMARK OFFICE
CERTIFICATE OF CORRECTION

PATENT NO. : 6,552,357 B2
DATED : April 22, 2003
INVENTOR(S) : Hironobu Akita

It is certified that error appears in the above-identified patent and that said Letters Patent is hereby corrected as shown below:

Title page,
Item [56], References Cited, OTHER PUBLICATIONS, "Kirihara" has been replaced with -- Kirihata --;

Column 16,
Line 12, "between-the" has been replaced with -- between the --.

Signed and Sealed this

Twenty-eighth Day of October, 2003

JAMES E. ROGAN
*Director of the United States Patent and Trademark Office*